US008610616B2

(12) United States Patent
Baghini et al.

(10) Patent No.: US 8,610,616 B2
(45) Date of Patent: Dec. 17, 2013

(54) SUCCESSIVE APPROXIMATION REGISTER ANALOG TO DIGITAL CONVERTER CIRCUIT

(75) Inventors: Maryam Shojaei Baghini, Maharashtra (IN); Vinayak Gopal Hande, Maharashtra (IN)

(73) Assignee: Indian Institute of Technology Bombay, Mumbai, Maharashtra (IN)

( * ) Notice: Subject to any disclaimer, the term of this patent is extended or adjusted under 35 U.S.C. 154(b) by 14 days.

(21) Appl. No.: 13/390,937

(22) PCT Filed: Nov. 17, 2010

(86) PCT No.: PCT/IB2010/002919
§ 371 (c)(1),
(2), (4) Date: Feb. 17, 2012

(87) PCT Pub. No.: WO2011/151671
PCT Pub. Date: Dec. 8, 2011

(65) Prior Publication Data
US 2012/0146829 A1 Jun. 14, 2012

(30) Foreign Application Priority Data
Jun. 2, 2010 (IN) .......................... 1699/MUM/2010

(51) Int. Cl.
*H03M 1/12* (2006.01)
(52) U.S. Cl.
USPC .......................................... 341/172; 341/155
(58) Field of Classification Search
USPC ................ 341/155, 172, 141, 144, 136
See application file for complete search history.

(56) References Cited

U.S. PATENT DOCUMENTS

| 4,129,863 | A | 12/1978 | Gray et al. |
| 4,517,549 | A | 5/1985 | Tsukakoshi |
| 5,973,633 | A | 10/1999 | Hester |
| 7,113,116 | B2 * | 9/2006 | Brewer et al. ................. 341/122 |
| 8,031,099 | B2 * | 10/2011 | Zhao et al. ..................... 341/150 |
| 8,384,579 | B2 * | 2/2013 | Sicard ........................... 341/172 |
| 2003/0063026 | A1 | 4/2003 | Nandy |

FOREIGN PATENT DOCUMENTS

EP        1303048 A1    4/2003

OTHER PUBLICATIONS

Brian P. Ginsburg et al., An Energy-Efficient Charge Recycling Approach for a SAR Converter With Capacitive DAC, In Proceedings of IEEE International Symposium Circuits and Systems, 2005, pp. 184-187, vol. 1.

(Continued)

*Primary Examiner* — Peguy Jean Pierre
(74) *Attorney, Agent, or Firm* — Ren-Sheng International

(57) ABSTRACT

Embodiments of the disclosure may generally relate to an analog to digital converter. An example analog to digital converter may include a unit capacitor array, a comparator and a control block. The unit capacitor array may include multiple capacitors coupled to one another via multiple switches under control of the control block. The comparator, having a first input and a second input, may be configured to receive a controlled voltage generated from the unit capacitor array and compare an analog voltage to the controlled voltage. The control block may be configured to selectively open or close the switches, receive a comparison result from the comparator, and generate a digital output based on the comparison result. The control block may be configured to control the switch timing of the unit capacitor array for reset, precharge, charge redistribution, and comparison phases, where a passive charge redistribution method may be utilized.

22 Claims, 12 Drawing Sheets

(56) References Cited

OTHER PUBLICATIONS

Brian P. Ginsburg et al., "500-Ms/s 5-bit ADC in 65-nm CMOS With Split Capacitor Array DAC", IEEE Journal of Solid-State Circuits, Apr. 2007, pp. 739-747, vol. 42, No. 4.

Jan Craninckx et al., A 65fJ/Conversion-Step 0-to-50MS/s 0-to-0.7mW 9b Charge-Sharing SAR ADC in 90nm Digital CMOS, IEEE International Solid-State Circuits Conference, 2007, pp. 246-247, ISSCC Digital Technology Papers.

Jeong-Sup Lee et al., "Capacitor Array Structure and Switch Control for Energy-Efficient SAR Analog-to-Digital Converters", In Proceedings of IEEE International Symposium Circuits and Systems, May 2008, pp. 236-239.

James L. McCreary et al., "AII-MOS Charge Redistribution Analog-to-Digital Conversion Techniques-Part I", IEEE Journal of Solid-State Circuits, Dec. 1975, pp. 371-379, vol. 10, No. 6.

Ricardo E. Suarez et al., "AII-MOS Charge Redistribution Analog-to-Digital Conversion Techniques-Part II", IEEE Journal of Solid-State Circuits, Dec. 1975, pp. 379-385, vol. 10, No. 6.

Lin Cong, "Pseudo C-2C Ladder-Based Data Converter Technique", IEEE Transactions on Circuits and Systems-II: Analog and Digital Signal Processing, Oct. 2001, pp. 927-929, vol. 48, No. 10.

Jens Sauerbrey et al., "A 0.5V, 1uW Successive Approximation ADC", In Proceedings of ESSCIRC, Sep. 26, 2002, pp. 247-250, Florence, Italy.

Michael D. Scott et al., "An Ultralow-Energy ADC for Smart Dust", IEEE Journal of Solid-State Circuits, Jul. 2003, pp. 1123-1129, vol. 38, No. 7.

Eugenio Culurciello et al., "An 8-Bit, 1MW Successive Approximation ADC in SOI CMOS", In Proceedings of IEEE International Symposium Circuits and Systems, May 2003, pp. I-301~I-304, vol. 1.

Fabrizio Erario et al., "Design of an Ultra-Low Power Time Interleaved SAR Converter", 4th Conference on Ph.D. Research in Microelectronics and Electronics, PRIME 2008, Jun. 2008, pp. 245-248, Istanbul.

Yasuhide Kuramochi et al., "A 0.05-mm2 110-uW 10-b Self-Calibrating Successive Approximation ADC Core in 0.18-um CMOS", In IEEE Asian Solid-State Circuits Conference, Nov. 12-14, 2007, pp. 224-227, Korea.

You-Kuang Chang et al., "A 8-bit 500-Ks/s Low Power SAR ADC for Bio-Medical Applications", In IEEE Asian Solid-State Circuits Conference, Nov. 12-14, 2007, pp. 2351-2354, Korea.

Karim Abdelhalim et al., "A Nanowatt Successive Approximation ADC with Offset Correction for Implantable Sensor Applications", In IEEE ISCAS, 2007, pp. 2351-2354.

KH. Hadidi et al., "An 8-b 1.3-MHz Successive-Approximation A/D Converter", In IEEE Journal of Solid-State Circuits, Jun. 1990, pp. 880-885, vol. 25, No. 3.

Jaejin Park et al., "A 1mW 10-bit 500KSPS SAR A/D Converter", Proceedings of 2000 IEEE International Symposium on Circuits and Systems (ISCAS), May 28, 2000, pp. 581-584.

Ying-Ming Liao et al., "A 6-b 1.3Gs/s A/D Converter with C-2C Switch-Capacitor Technique", In International Symposium on VLSI Design, Automation and Test, Apr. 2006, pp. 1-4.

Notification of Transmittal of the International Search Report and the Written Opinion of the International Searching Authority, Jul. 12, 2011.

Hande et al., "An Ultra Low-Energy DAC for Successive Approximation ADCs", Proceedings of 2010 IEEE International Symposium On Circuits And Systems (ISCAS), pp. 3349-3352, May 30, 2010 Abstract; Section II, "Unit Capacitor Array Method"; Figs. 1-3[(a)-(f)].

Lee et al., "Capacitor Array Structure And Switch Control For Energy-Efficient SAR Analog-To-Digital Converters", Proceedings of 2008 IEEE International Symposium On Circuits And Systems (ISCAS), May 2008, pp. 236-239 Section III, "Capacitor Switching Method", A. "Junction-Splitting Capacitor Array"; Figs. 4(a) & (b), 6(a) & (b), 7(a) & (b).

Ginsburg et al., "An Energy-Efficient Charge Recycling Approach For A SAR Converter With Capacitive DAC", Proceedings of 2005 IEEE International Symposium On Circuits And Systems (ISCAS), May 2005, pp. 184-187 Section II, "SAR Algorithm And Converter"; Section III, "Capacitor Switching Methods"; Figs. 6(a) & (b), Figs. 7(a) & (b).

Xingyuan Tong et al., "Low-Power Capacitor Arrays for Charge Redistriution SAR A/D Converter in 65nm CMOS", Pacific-Asia Conference on Circuits, Communications and System, 2009, pp. 293-296.

\* cited by examiner

SUCCESSIVE APPROXIMATION REGISTER ANALOG TO DIGITAL CONVERTER CIRCUIT

CROSS-REFERENCE TO RELATED APPLICATION

The present application is a 371 application of International Application PCT/IB2010/002919, filed on Nov. 17, 2010 and entitled "SUCCESSIVE APPROXIMATION REGISTER ANALOG TO DIGITAL CONVERTER CIRCUIT." The International Application claims priority to a corresponding patent application filed in India and having application number 1699/MUM/2010, filed on Jun. 2, 2010. The Indian patent application and the International Application, including any appendices or attachments thereof, are incorporated by reference herein in their entireties.

TECHNICAL FIELD

The present disclosure relates generally to analog to digital conversion and more specifically to a successive approximation register analog to digital convert circuit.

BACKGROUND

Unless otherwise indicated herein, the materials described in this section are not prior art to the claims in this application and are not admitted to be prior art by inclusion in this section.

A successive approximation register analog to digital converter (ADC) typically utilizes a binary weighted capacitor array. The binary weighted capacitor array is configured to process a first reference voltage to convert the first reference voltage into a second reference voltage. The successive approximation register ADC may further include a comparator, which is configured to compare the second reference voltage against an analog input voltage. A digital output bit may be generated based on the comparison. The present disclosure has identified that various techniques that have been proposed to try to reduce the energy needed to complete the analog to digital conversion process are inadequate. Some example techniques contemplated in the present disclosure include a two step switching method, a capacitor splitting method, a charge sharing method, and a junction-splitting capacitor array method.

SUMMARY

One embodiment of the disclosure may relate to an analog to digital converter. The analog to digital converter may include a capacitor array, a comparator, and a control block. The capacitor array may include multiple capacitors and switches. A first switch is coupled between a first reference voltage node and a first terminal of a first capacitor. A second switch is coupled between a second terminal of the first capacitor and a second reference node. A third switch is coupled between the first terminal of the first capacitor and a first terminal of a second capacitor. A fourth switch is coupled between the second terminal of the first capacitor and the first terminal of the second capacitor. A fifth switch is coupled between the second terminal of the second capacitor and the second reference node. A sixth switch is coupled between the first terminal of the second capacitor and a first terminal of a third capacitor. A seventh switch is coupled between the first terminal of the third capacitor and the second terminal of the second capacitor. In addition, a second terminal of the third capacitor is coupled to the second reference node. An eighth switch is coupled between the first terminal of the third capacitor and a first terminal of a fourth capacitor. A second terminal of the fourth capacitor is coupled to the second reference node. A ninth switch is coupled between an output terminal of the capacitor array and a third reference node. A tenth switch is coupled between the output terminal of the capacitor array and the first terminal of the first capacitor. An eleventh switch is coupled between the output terminal of the capacitor array and the first terminal of the second capacitor. A twelfth switch is coupled between the output terminal of the capacitor array and the first terminal of the third capacitor. A first input of the comparator is coupled to an analog signal input node. A second input of the comparator is coupled to the output terminal of the capacitor array. The comparator is configured to compare signals received from the analog input node to signals received from the output terminal of the capacitor array. A feedback input terminal of the control block is coupled to the output terminal of the comparator. The control block is configured to selectively open or close switches, receive a comparison result from the comparator, and generate a digital output based on the comparison result.

Another embodiment of the disclosure may relate to a method for converting an analog signal to a digital signal. The method may include resetting capacitors in a capacitor array of an analog to digital converter by discharging the capacitors, actuating a third switch, a tenth switch, a twelfth switch and an eleventh switch to be operated in an opened position and a first switch to be operated in a closed position to actively charge a first capacitor in the capacitor array, actuating a first switch to be operated in an opened position to passively charge the remaining capacitors in the capacitor array, generating a digital signal based on a comparison result between an analog signal and an output signal of the capacitor array, wherein the output signal is associated with operated positions of the remaining switches in the capacitor array, and determining whether the resolution of the analog to digital converter has been achieved.

Yet another embodiment of the disclosure may relate to an analog to digital converter. The analog to digital converter may include a first capacitor array, a differential difference comparator, and a control block. The first capacitor array may include multiple capacitors and switches. A first switch is coupled between a first reference voltage node and a first terminal of a first capacitor. A second switch is coupled between a second terminal of the first capacitor and a second reference node. A third switch is coupled between the first terminal of the first capacitor and a first terminal of a second capacitor. A fourth switch is coupled between the second terminal of the first capacitor and the first terminal of the second capacitor. A fifth switch is coupled between the second terminal of the second capacitor and the second reference node. A sixth switch is coupled between the first terminal of the second capacitor and a first terminal of a third capacitor. A seventh switch is coupled between the first terminal of the third capacitor and the second terminal of the second capacitor. In addition, a second terminal of the third capacitor is coupled to the second reference node. An eighth switch is coupled between the first terminal of the third capacitor and a first terminal of a fourth capacitor. A second terminal of the fourth capacitor is coupled to the second reference node. A ninth switch is coupled between an output terminal of the capacitor array and a third reference node. A tenth switch is coupled between the output terminal of the capacitor array and the first terminal of the first capacitor. An eleventh switch is coupled between the output terminal of the capacitor array and the first terminal of the second capacitor. A twelfth switch is coupled between the output terminal of the capacitor array and the first terminal of the third capacitor. A first input of the differential difference comparator is coupled to a first analog signal input node. A second input of the differential difference comparator is coupled to the output terminal of the first capacitor array. A feedback input terminal of the control block is coupled to the output terminal of the differential difference comparator. The control block is configured to selectively open or close switches, receive a comparison result from the differential difference comparator, and generate a digital output based on the comparison result.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1A:
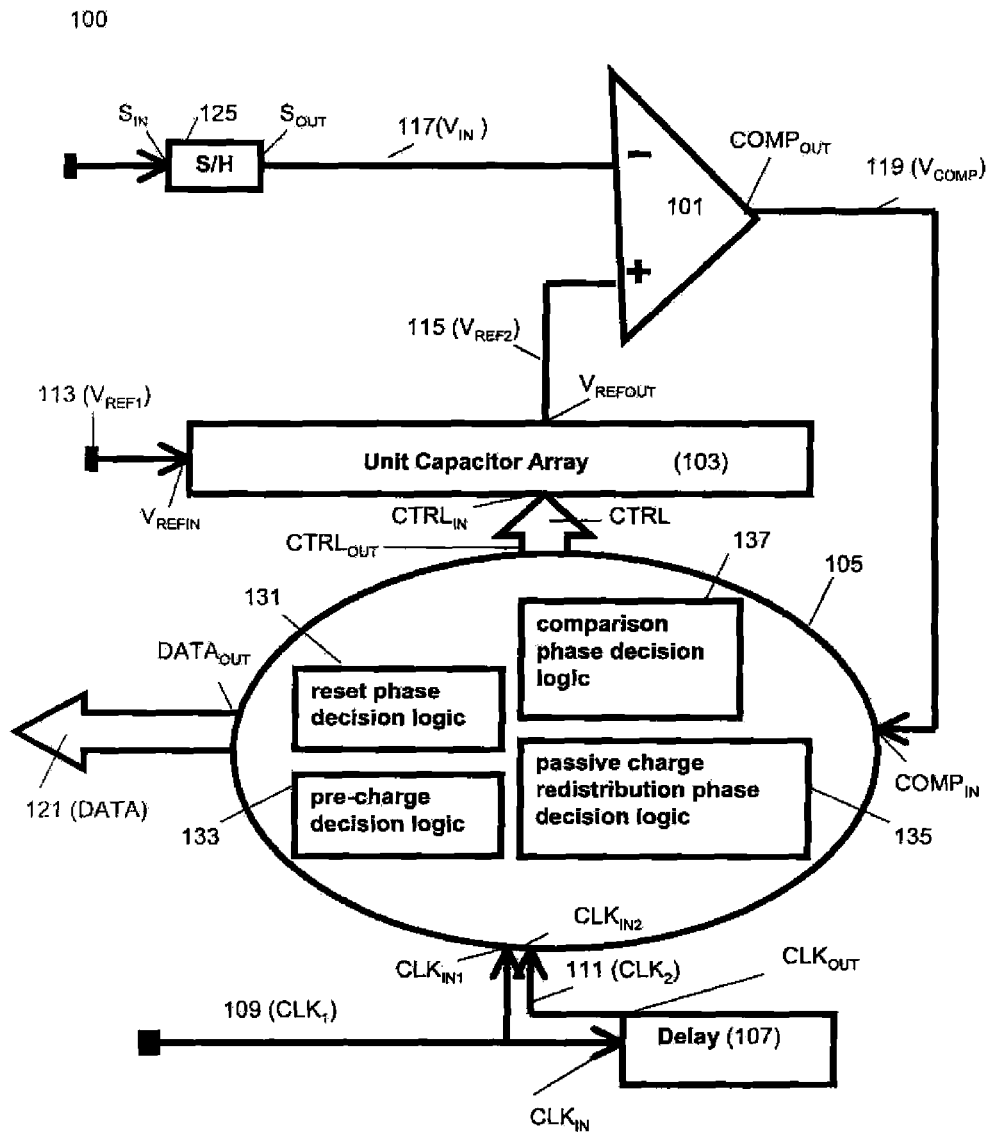
FIG. 1A shows a circuit diagram of an example successive approximation register ADC.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented here. It will be readily understood that the aspects of the present disclosure, as generally described herein, and illustrated in the Figures, can be arranged, substituted, combined and designed in a wide variety of different configurations, all of which are explicitly contemplated and make part of this disclosure.

This disclosure is drawn, inter alia, to methods, apparatus, computer programs, and systems related to generating a digital output with a successive approximation register ADC.

In this disclosure, a "unit capacitor array" generally refers to a set of capacitors, each of equivalent capacitance value, arranged in an array (1-D, 2-D, etc.). A minimum number of unit capacitors in the array can be implemented after having considered certain desired properties (e.g., desired resolution, step size, etc.) of an ADC.

Briefly stated, techniques are generally described herein for analog to digital conversion. Some example ADC converters described herein include a unit capacitor array coupled to a reference voltage, where the capacitor array includes multiple capacitors coupled to one another via multiple switches under control of a control block. A comparator, having a first input and a second input, is configured to receive a controlled voltage generated from the unit capacitor array and compare an analog voltage to the controlled voltage. The control block is configured to selectively open or close the switches, receive a comparison result from the comparator, and generate a digital output based on the comparison result. The control block is configured to control the switch timing of the unit capacitor array for reset, pre-charge, charge redistribution, and comparison phases, where a passive charge redistribution method may be utilized.

FIG. 1A shows a circuit diagram of an example a successive approximation register ADC 100 that is arranged in accordance with at least some embodiments described herein.

The ADC 100 includes a comparator 101, a unit capacitor array 103, a control block 105, a time delay circuit 107, and a sample and hold circuit 125. The comparator 101 includes a first input terminal (+), a second input terminal (−), and an output terminal ($COMP_{OUT}$). The unit capacitor array 103 includes a reference input terminal (e.g., $V_{REFIN}$), a control input terminal ($CTRL_{IN}$), and a reference output terminal (e.g., $V_{REFOUT}$). The time delay circuit 107 includes a clock input terminal ($CLK_{IN}$), and a clock output terminal ($CLK_{OUT}$). The control block 105 includes a first clock input terminal ($CLK_{IN1}$), a second clock input terminal ($CLK_{IN2}$), a feedback input terminal ($COMP_{IN}$), a control output terminal ($CTRL_{OUT}$), and a conversion output terminal ($DATA_{OUT}$). The sample and hold circuit (S/H) 125 includes an input terminal ($S_{IN}$) and an output terminal ($S_{OUT}$)

The S/H circuit 125 is configured to receive a signal to be sampled from the input terminal ($S_{IN}$) and output the analog input voltage ($V_{IN}$, 117). The analog input signal (e.g., $V_{IN}$, 117) for the conversion is coupled to the first input terminal (−) of the comparator 101. The second input terminal (+) of the comparator 101, which corresponds to a second reference voltage ($V_{REF2}$, 115), is coupled to the output terminal (e.g., $V_{REFOUT}$) of the unit capacitor array 103. The output terminal ($COMP_{OUT}$) of the comparator 101, which corresponds to a comparison result ($V_{COMP}$, 119), is coupled to the input terminal ($COMP_{IN}$) of the control block 105. A first reference voltage ($V_{REF1}$, 113) is coupled to the reference input terminal ($V_{REFIN}$) of the unit capacitor array 103. The control output terminal ($CTRL_{OUT}$) of the control block 105, which corresponds to a control signal (CTRL), is coupled to the control input terminal ($CTRL_{IN}$) of the unit capacitor array (103). A first clock signal ($CLK_1$, 109) is coupled to the clock input terminal ($CLK_{IN}$) of the time delay circuit 107 and a first clock input terminal ($CLK_{IN1}$) of the control block 105. The clock output terminal ($CLK_{OUT}$) of the time delay circuit 107, which corresponds to a second clock signal (CLK$_2$, 111), is coupled to the second clock input terminal (CLK$_{IN2}$) of the control block 105.

The time delay circuit 107 is configured to generate the second clock signal (CLK$_2$, 111) in response to the first clock signal (CLK$_1$, 109). The second clock signal (CLK$_2$, 111) may be delayed in time so that a first pulse of the first clock signal 109 and a second pulse of the second clock signal 111 may be alternately fed into the control block 105. In some embodiments, having non-overlapping clock pulses helps to support multiple switching sequences (e.g., 6) for multiple phases (e.g., 6) and reduces operation time (e.g., from six cycles to three cycles.)

The control block 105 is configured to control switches in the unit capacitor array 103 based on the first clock signal (CLK$_1$, 109) and the second clock signal (CLK$_2$, 111). The control block 105 may include decision logic that identifies a phase or operating state for the ADC, and dynamically adjusts the control of the switches in the unit capacitor array 103 based on the identified phase. Example decision logic may include a reset phase decision logic component 131, a pre-charge decision logic component 133, a passive charge redistribution phase decision logic component 135, and a comparison phase decision logic component 137. The various decision logic components set forth above may correspond to various example phases or operating states for the ADC, (e.g., a reset phase, a pre-charge phase, a passive charge redistribution, and a comparison phase). For example, when the control block 105 receives the first pulse of the first clock signal (CLK$_1$, 109), the control block 105 can configure the unit capacitor array 103 to operate in a first phase (e.g., reset). When the control block 105 receives a second pulse of the second clock signal (CLK$_2$, 109), the control block 105 can configure the unit capacitor array 103 to operate in a second phase (e.g., pre-charge). Therefore, as the control block 105 receives the first clock signal 109 and the second clock signal 111, the unit capacitor array 103 may operate in varying phases or operating states.

The unit capacitor array 103 is dynamically configured (e.g., via CTRL from control block 105) to generate the second reference voltage (V$_{REF2}$, 115) as a scaled version of the first reference voltage (V$_{REF1}$, 113). In some examples, the relationship between the first reference voltage (V$_{REF1}$, 113) and the second reference voltage (V$_{REF2}$, 115) may be determined by a multi-bit control word such as CTRL=$b_7b_6b_5b_4b_3b_2b_1b_0$. For example, V$_{REF2}$=V$_{REF1}$*X, where X is determined as:

$$X = b_7 * 7/8 + b_6 * 6/8 + b_5 * 5/8 + b_4 * 5/8 + b_3 * 4/8 + b_2 * 3/8 + b_1 * 2/8 + b_0 * 1/8.$$

The values of the second reference voltage (V$_{REF2}$, 115) may be changed by the control block 105 adjusting the multi-bit control word (X) based on changes of the phase or operating state.

The comparator 101 is configured to compare the analog input voltage (V$_{IN}$, 117) against with the second reference voltage (V$_{REF2}$, 115). The comparison result (V$_{COMP}$, 119) is then coupled to the control block 105, which is configured to generate a digital output (DATA, 121) at the conversion output terminal (DATA$_{OUT}$) based on the comparison result (V$_{COMP}$, 119).

In some embodiments, the unit capacitor array 103 may include multiple switches and multiple capacitors that are selectively coupled together by the switches. The numbers of the switches and the value of the capacitors are associated with the resolution of the successive approximation register ADC 100. The operation of each switch (i.e., off or opened vs. on or closed) of a switch may be controlled by the control block 105 based on the phase/operating state, which may be determined in response to the first clock signal 109 and the second clock signal 111. For example, a particular switch may be opened when the control block 105 receives a first pulse of the first clock signal 109, and the particular switch may be closed when the control block 105 receives a second pulse of the second clock signal 111. In some embodiments, each phase of operation for the unit capacitor array 103 corresponds to a specific set of settings for the switches. Through the various phases of operations for the unit capacitor array 103, different values of the second reference voltage (V$_{REF1}$, 115) may be obtained.

Figure 1B:
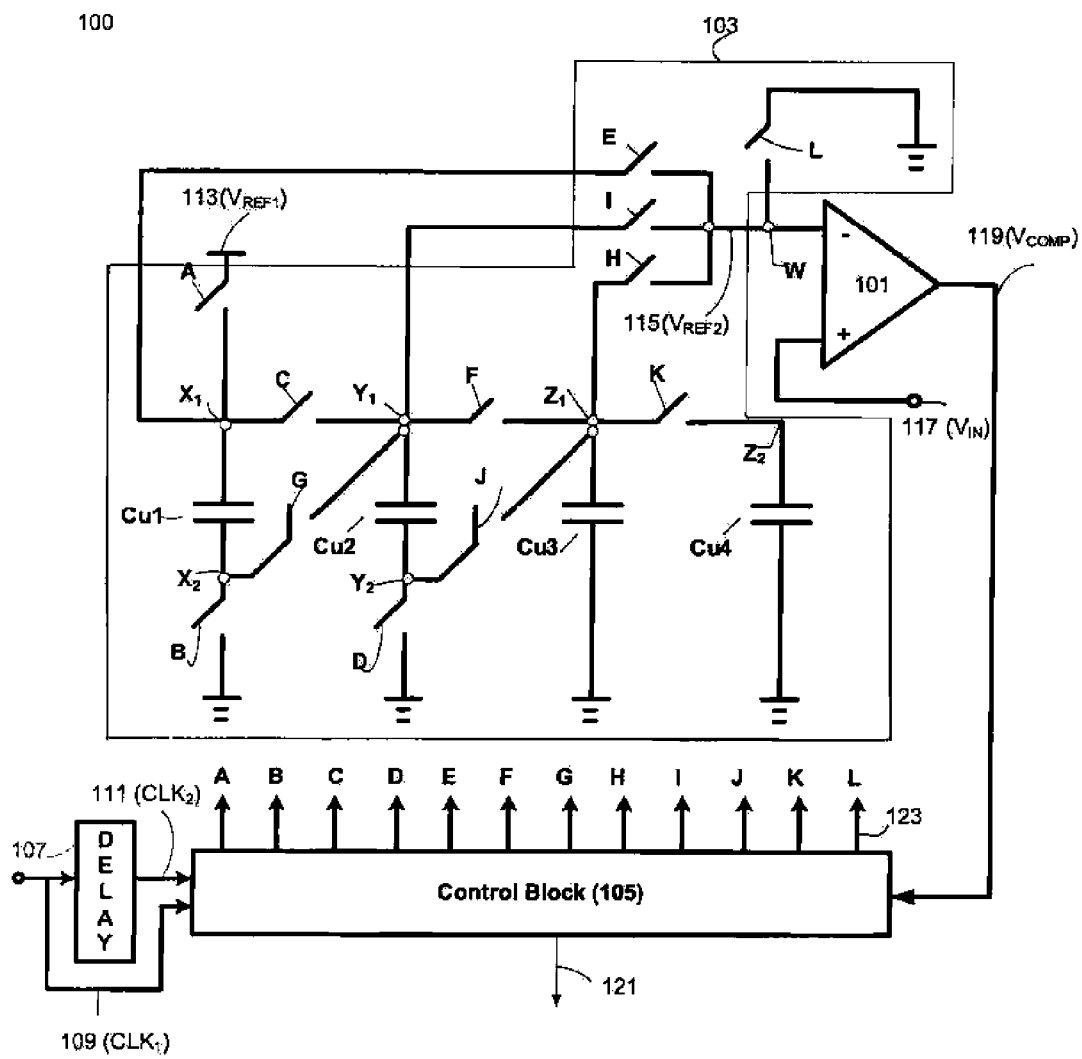
FIG. 1B shows a circuit diagram of an example successive approximation register ADC in which switches and capacitors of an example unit capacitor array are shown.

FIG. 1B shows a circuit diagram of an example successive approximation register ADC in which switches and capacitors of an example unit capacitor array are shown, in accordance with at least embodiments described herein. For purposes of illustration, the successive approximation register ADC may have a 3-bit resolution. In conjunction with FIG. 1A, the unit capacitor array 103 includes twelve switches A, B, C, D, E, F, G, H, I, J, K, and L. The unit capacitor array 103 further includes four capacitors C$_{u1}$, C$_{u2}$, C$_{u3}$, and C$_{u4}$. The control block 105 may be configured to assert a set of signals 123 to open or close the twelve switches. Each switch may be controlled to be opened or closed independently from the other switches. As mentioned above, the specific manner in which the switches are opened or closed may define a phase of operation for the unit capacitor array 103. In some embodiments, different phases of operations may result in a different reference voltage (V$_{REF2}$, 115) at a node W. The analog input voltage 117 may be compared against the different reference voltages (V$_{REF2}$, 115) at different phases of operations for the unit capacitor array 103. Each comparison may result in the control block 105 to generate a 1-bit digital output (DATA, 121). In some embodiments, for a successive approximation register ADC 100 having a 3-bit resolution, the open or close of the illustrated twelve switches may be categorized into four switching sequences.

A first switching sequence is further described below.

Table 1 shows the first switching sequence of the twelve switches A, B, C, D, E, F, G, H, I, J, K, and L for a series of example operating phases I-VI. The number "1" in a cell means that the switch corresponding to the cell is closed. The number "0" in a cell means that the switch corresponding to the cell is opened.

TABLE 1

| Phase | A | B | C | D | E | F | G | H | I | J | K | L |
|---|---|---|---|---|---|---|---|---|---|---|---|---|
| I | 0 | 1 | 1 | 1 | 0 | 1 | 1 | 0 | 0 | 1 | 1 | 1 |
| II | 1 | 1 | 0 | 1 | 0 | 1 | 1 | 0 | 0 | 1 | 1 | 1 |
| III | 0 | 1 | 1 | 1 | 0 | 0 | 0 | 0 | 0 | 1 | 1 | 1 |
| IV | 0 | 1 | 0 | 1 | 1 | 1 | 0 | 0 | 0 | 0 | 0 | 0 |
| V | 0 | 1 | 0 | 1 | 0 | 0 | 0 | 0 | 1 | 0 | 1 | 0 |
| VI | 0 | 1 | 0 | 1 | 0 | 0 | 0 | 1 | 0 | 0 | 0 | 0 |

Figure 2A:
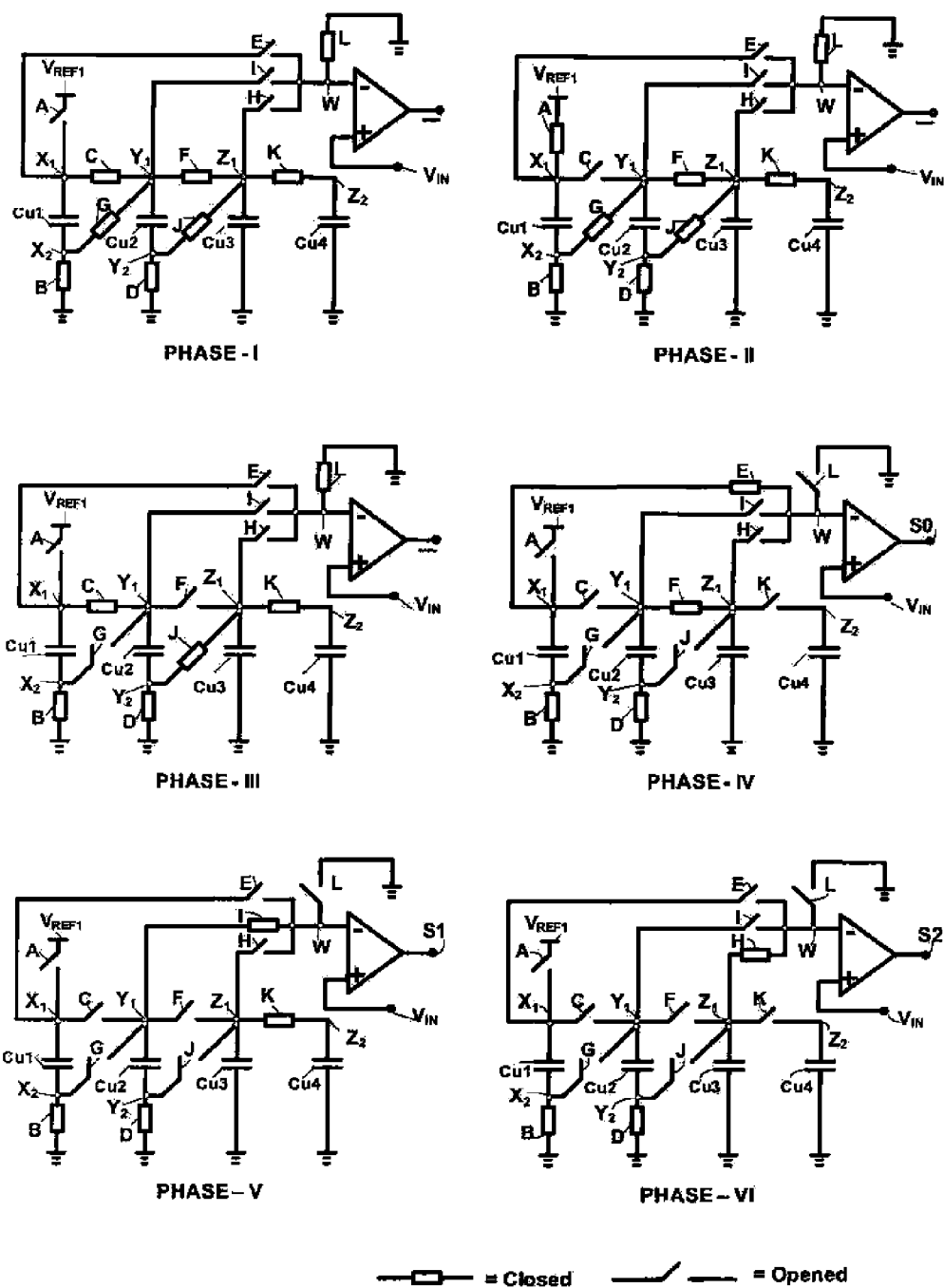
FIG. 2A shows a set of circuit diagrams of an example unit capacitor array in which switches are configured to carry out the switching sequence shown in Table 1.

FIG. 2A shows a set of circuit diagrams of an example unit capacitor array in which switches are configured to carry out the switching sequence shown in Table 1, in accordance with at least some embodiments described herein. The circuit configuration shown in FIG. 2A is substantially the same as that shown in FIG. 1, with further detail concerning the switching of the unit capacitors and the related control signals.

Four capacitors are shown in FIG. 2A as part of the unit capacitor array 103, corresponding to capacitors C$_{u1}$, C$_{u2}$, C$_{u3}$ and C$_{u4}$. Capacitor C$_{u1}$ is coupled between node X$_1$ and node X$_2$. Capacitor C$_{u2}$ is coupled between node Y$_1$ and node Y$_2$. Capacitor C$_{u3}$ is coupled between node Z$_1$ and a circuit ground. Capacitor C$_{u4}$ is coupled between node Z$_2$ and the circuit ground. The first input terminal (−) of the comparator 101 corresponds to node W. Twelve switches are shown in FIG. 2A as part of the unit capacitor array 103, corresponding to switches A-L. Switch A is coupled between the first reference voltage ($V_{REF1}$, 113) and node $X_1$. Switch B is coupled between node $X_2$ and a circuit ground. Switch C is coupled between node $X_1$ and node $Y_1$. Switch D is coupled between node $Y_2$ and the circuit ground. Switch E is coupled between node W and node $X_1$. Switch F is coupled between node $Y_1$ and node $Z_1$. Switch G is coupled between node $Y_1$ and node $X_2$. Switch H is coupled between node W and node $Z_1$. Switch I is coupled between node W and node $Y_1$. Switch J is coupled between node $Z_1$ and node $Y_2$. Switch K is coupled between node $Z_1$ and node $Z_2$. Switch L is coupled between node W and the circuit ground.

At phase I of FIG. 2A, switches B, C, D, F, G, J, K, and L are operated in a closed position and switches A, E, I, H are operated in an opened position such that the unit capacitor array is effectively discharged. While switches E, I and H are in the open position, node W is isolated from capacitors $C_{u1}$, $C_{u2}$, $C_{u3}$, and $C_{u4}$. Since switch L is in the closed position, node W is coupled to ground through switch L. Switches B, C and G are all in the closed position, resulting in both top and bottom plates of capacitor $C_{u1}$ being coupled to ground. Switches D, J and F are all in the closed position, resulting in both top and bottom plates of capacitors $C_{u2}$ and $C_{u3}$ being coupled to ground. Switch K is also in the closed position, resulting in both top and bottom plates of capacitor $C_{u4}$ being coupled to ground.

In sum, at phase I, the charges $Q_{Cu1}$, $Q_{Cu2}$, $Q_{Cu3}$ and $Q_{Cu4}$ on capacitors $C_{u1}$, $C_{u2}$, $C_{u3}$, and $C_{u4}$, respectively, are discharged to the circuit ground and the reference voltage input to the comparator is set to the ground potential such that the output of the comparator $V_{COMP}$ should correspond to a logic "0" (e.g., 0 volts). The charges and voltages can thus be given as:

$$Q_{Cu1(Phase\ I)} = Q_{Cu2(Phase\ I)} = Q_{Cu3(Phase\ I)} = Q_{Cu4(Phase\ I)} = 0$$

$$V_{W(Phase\ I)} = 0 \text{ (i.e., circuit ground)}$$

$$V_{COMP(Phase\ I)} = \text{Logic 0 (e.g., 0V, VSS, circuit ground, etc.)}$$

At phase II of FIG. 2A, switches A, B, D, F, G, J, K, and L are operated in a closed position while the remaining switches are operated in an opened position. Such a switch configuration couples the top plate of capacitor $C_{u1}$ to the reference voltage $V_{REF1}$ to effectively charge capacitor $C_{u1}$. The charge (Q) stored in a capacitor can be determined from the capacitance value of the capacitor (C), and the potential difference (V) across the top and bottom plates of the capacitor (i.e., Q=C·V). Assuming the ground potential at the bottom plate of capacitor $C_{u1}$ corresponds to 0 volts, the total charges $Q_{Cu1}$ stored on capacitor $C_{u1}$ at phase II can be determined as:

$$Q_{Cu1(Phase\ II)} = C_{u1} \cdot V_{REF1} \quad \text{(Eq. 1)}$$

In phase II, capacitors $C_{u2}$, $C_{u3}$ and $C_{u4}$ remain held in a discharged state, where both top and bottom plates of the capacitors are coupled to the circuit ground through switches B, G, D, F, and K. Also in phase II, node W remains coupled to the circuit ground through switch L such that the output of the comparator should remain at a logic "0" level. The corresponding charges and voltages can thus be given as:

$$Q_{Cu2(Phase\ II)} = Q_{Cu3(Phase\ II)} = Q_{Cu4(Phase\ II)} = 0$$

$$V_{W(Phase\ II)} = 0$$

$$V_{COMP(Phase\ II)} = \text{Logic 0 (e.g., 0V)}$$

At phase III of FIG. 2A, switches B, C, D, J, K, and L are operated in the closed position while the remaining switches operated in an opened position. The charges $Q_{Cu1}$ originally stored on the capacitor $C_{u1}$ at phase II are redistributed in phase III between capacitors $C_{u1}$ and $C_{u2}$. Under principles of charge conservation, this can be represented as:

$$Q_{Cu1(Phase\ II)} = Q_{Cu1(Phase\ III)} + Q_{Cu2(Phase\ III)} \quad \text{(Eq. 2)}$$

The charge $Q_{Cu1}$ stored on capacitor $C_{u1}$ is given by $Q_{Cu1} = C_{u1} \cdot V_{X1}$, where $V_{X1}$ is the voltage at node $X_1$. Similarly, the charge $Q_{Cu2}$ stored on capacitor $C_{u2}$ is given by $Q_{Cu2} = C_{Cu2} \cdot V_{Y1}$, where $V_{Y1}$ is the voltage at node $Y_1$. Substituting Eq. 1 into Eq. 2 can thus be expressed as:

$$C_{u1} \cdot V_{REF1} = C_{u1} \cdot V_{X1(Phase\ III)} + C_{u2} \cdot V_{Y1(Phase\ III)} \quad \text{(Eq. 3)}$$

Since nodes $X_1$ and $Y_1$ are coupled together through switch C, they should have substantially the same voltage (ignoring losses in the switches), yielding:

$$C_{u1} \cdot V_{REF1} = (C_{u1} + C_{u2}) \cdot V_{X1(Phase\ III)} = (C_{u1} + C_{u2}) \cdot V_{Y1(Phase\ III)} \quad \text{(Eq. 4)}$$

Solving for $V_{X1(phase\ III)}$:

$$V_{X1(Phase\ III)} = V_{Y1(Phase\ III)} = V_{REF1} \cdot (C_{u1})/(C_{u1} + C_{u2}) \quad \text{(Eq. 5)}$$

In some embodiments, where capacitor $C_{u1}$ and the capacitor $C_{u2}$ have the same capacitance value of C, the charges are equally re-distributed though switch B, C and D to capacitors $C_{u1}$ and $C_{u2}$. For this example, the charges $Q_{Cu1}$ and $Q_{Cu2}$ stored on capacitors $C_{u1}$ and $C_{u2}$ in phase III can be represented as:

$$Q_{Cu1(Phase\ III)} = Q_{Cu2(Phase\ III)} = (½) \cdot Q_{Cu1(Phase\ II)}. \quad \text{(Eq. 6)}$$

Also, the voltage $V_{X1}$ and $V_{Y1}$ at nodes $X_1$ and $Y_1$ from Eq. 5 can be simplified as:

$$V_{X1(phase\ III)} = V_{Y1(Phase\ III)} = (½) \cdot V_{REF1}. \quad \text{(Eq. 7)}$$

Also at phase III, capacitors $C_{u3}$ and $C_{u4}$ are held in a discharged state where both top and bottom plates are coupled to the circuit ground through switches D, J and K, and node W remains coupled to the circuit ground through switch L. The corresponding charges and voltages can thus be given as:

$$Q_{Cu3(Phase\ III)} = Q_{Cu4(phase\ III)} = 0$$

$$V_{W(Phase\ III)} = 0$$

$$V_{COMP(Phase\ III)} = \text{Logic 0}.$$

At phase IV of FIG. 2A, switches B, D, E, and F are operated in a closed position while the remaining switches are operated in an opened position. In phase IV, the charges $Q_{Cu2}$ originally stored on the capacitor $C_{u2}$ at phase III are redistributed between capacitors $C_{u2}$ and $C_{u3}$ though switches D and F, yielding the following charge equation:

$$Q_{Cu2(Phase\ III)} = Q_{Cu2(Phase\ IV)} + Q_{Cu3(Phase\ IV)} \quad \text{(Eq. 8)}$$

The charge $Q_{Cu2}$ stored on capacitor $Q_{Cu2}$ is given by $Q_{Cu2} = C_{u2} \cdot V_{Y1}$, where $V_{Y1}$ is the voltage at node $Y_1$. Similarly, the charge $Q_{Cu3}$ stored on capacitor $C_{u3}$ is given by $Q_{Cu3} = C_{u3} \cdot V_{Z1}$, where $V_{Z1}$ is the voltage at node $Z_1$. Substituting into Eq. 8, yields:

$$C_{u2} \cdot V_{Y1(Phase\ III)} = C_{u2} \cdot V_{Y1(Phase\ IV)} + C_{u3} \cdot V_{Z1(Phase\ IV)} \quad \text{(Eq. 9)}$$

Since nodes $Y_1$ and $Z_1$ are coupled together through switch F, they should have substantially the same voltage (ignoring losses in the switches) at Phase IV, yielding:

$$C_{u2} \cdot V_{Y1(Phase\ III)} = (C_{u2} + C_{u3}) \cdot V_{Y1(Phase\ IV)} = (C_{u2} + C_{u3}) \cdot V_{Z1(Phase\ IV)} \quad \text{(Eq. 10)}$$

Solving for $V_{Y1(phase\ IV)}$:

$$V_{Y1(Phase\ IV)} = V_{Z1(Phase\ IV)} = V_{Y1(Phase\ III)} (C_{u1})/(C_{u2} + C_{u3}) \quad \text{(Eq. 11)}$$

Substituting Eq. 5 into Eq. 11 yields:

$$V_{Y1(Phase\ IV)} = V_{Z1(Phase\ IV)} = V_{REF1} \cdot C_{u1} \cdot C_{u2}/\{(C_{u2}+C_{u3})\cdot(C_{u1}+C_{u2})\} \quad \text{(Eq. 12)}$$

In some embodiments, where capacitors $C_{u2}$ and $C_{u3}$ have the same capacitance value of C, the charges $Q_{Cu2}$ originally stored on the capacitor $C_{u2}$ at the phase III is equally redistributed to capacitors $C_{u2}$ and $C_{u3}$. For this example, the charges $Q_{Cu2}$ and $Q_{Cu3}$ stored on capacitors $C_{u2}$ and $C_{u3}$ at phase IV can be given as:

$$Q_{Cu2(Phase\ IV)} = Q_{Cu3(Phase\ IV)} = (1/2)\cdot Q_{Cu2(Phase\ III)} \quad \text{(Eq. 13)}$$

Since the charge $Q_{Cu2}$ stored on capacitor $C_{u2}$ is given by $Q_{Cu2} = C \cdot V_{Y1}$, for a capacitance value of C, Eq. 7 can be substituted into Eq. 13, yielding:

$$Q_{Cu2(Phase\ IV)} = (1/2)\cdot C \cdot V_{Y1(Phase\ III)} = (1/4)\cdot C \cdot V_{REF1}. \quad \text{(Eq. 14)}$$

In addition, the voltage $V_{Y1}$ at a node $Y_1$ as depicted in FIG. 2A at phase IV is:

$$V_{Y1(Phase\ IV)} = Q_{Cu2(Phase\ IV)}/C = (1/4)\cdot V_{REF1}. \quad \text{(Eq. 15)}$$

Similarly, the voltage $V_{Z1}$ at a node $Z_1$ as depicted in FIG. 2A at phase IV is:

$$V_{Z1(Phase\ IV)} = Q_{Cu3(Phase\ IV)}/C = (1/4)\cdot V_{REF1}. \quad \text{(Eq. 16)}$$

Since switches B and E are closed in phase IV, node W is coupled to node $X_1$ and capacitor $C_{u1}$ effectively maintains the voltage ($V_W$) at node W, which can be given as:

$$V_{W(Phase\ IV)} = V_{X1(Phase\ IV)} = (1/2)\cdot V_{REF1}. \quad \text{(Eq. 17)}$$

Also in phase IV, capacitor $C_{u4}$ is decoupled from node $Z_1$ since switch K is in the opened position. However, capacitor $C_{u4}$ should otherwise have effectively no stored charge since it was previously coupled to ground through switches K, J, and D in the prior phase.

The comparator is configured to compare the second reference voltage $V_{REF2}$, which corresponds to the voltage $V_W$ at node W, against the analog input voltage $V_{IN}$. A digital output bit $S_0$ may be generated based on the comparison. For example, when the analog input voltage ($V_{IN}$) is greater than the second reference voltage $V_W$, then $S_0$ has a value corresponding to "Logic 1" or the equivalent signal level (e.g., 5V). When the analog input voltage ($V_{IN}$) is less than the second reference voltage $V_W$, then $S_0$ has a value corresponding to "Logic 0" or the equivalent signal level (e.g., a low supply voltage such as VSS or −5V for dual supply systems, or a circuit ground voltage such as 0V for single supply voltage systems).

At phase V of FIG. 2A, switches B, D, I, and K are operated in a closed position while the remaining switches are operated in an opened position. Since switch I is in a closed position in phase V, node $Y_1$ is coupled to node W and the voltage ($V_W$) at the node W can be given as:

$$V_{W(Phase\ V)} = V_{Y1(Phase\ IV)} \quad \text{(Eq. 18)}$$

Substituting Eq. 12 yields:

$$V_{W(Phase\ V)} = V_{REF1} \cdot C_{u1} \cdot C_{u2}/\{(C_{u2}+C_{u3})\cdot(C_{u1}+C_{u2})\} \quad \text{(Eq. 19)}$$

or $$V_{W(Phase\ V)} = (1/4)\cdot V_{REF1}, \text{ when } C_{u1} = C_{u3} = C_{u4} = C. \quad \text{(Eq. 20)}$$

At phase V, a comparator is configured to compare the second reference voltage $V_{REF2}$, which corresponds to the voltage ($V_W$) at node W, against the analog input voltage ($V_{IN}$). A digital output bit $S_1$ may be generated based on the comparison. For example, when the analog input voltage ($V_{IN}$) is greater than the second reference voltage $V_W$, then $S_1$ has a value corresponding to "Logic 1" or the equivalent signal level (e.g., the high supply voltage). When the analog input voltage ($V_{IN}$) is less than the second reference voltage $V_W$, then $S_1$ has a value corresponding to "Logic 0" or the equivalent signal level (e.g., a low supply voltage such as VSS for dual supply systems, or a circuit ground level such as 0V for single supply voltage systems).

Also in phase V, the charges originally stored on the capacitor $C_{u3}$ at phase IV are re-distributed through switch K to capacitors $C_{u3}$ and $C_{u4}$, yielding the following charge equation:

$$Q_{Cu3(Phase\ IV)} = Q_{Cu3(Phase\ V)} + Q_{Cu4(Phase\ V)} \quad \text{(Eq. 21)}$$

The charge $Q_{Cu3}$ stored on capacitor $C_{u3}$ is given by $Q_{Cu3} = C_{u3} \cdot V_{Z1}$, where $V_{Z1}$ is the voltage at node $Z_1$. Similarly, the charge $Q_{Cu4}$ stored on capacitor $C_{u4}$ is given by $Q_{Cu4} = C_{u4} \cdot V_{Z1}$, where $V_{Z2}$ is the voltage at node $Z_2$. Substituting into Eq. 21, yields:

$$C_{u3} \cdot V_{Z1(Phase\ IV)} = C_{u3} \cdot V_{Z1(Phase\ V)} + C_{u4} \cdot V_{Z2(Phase\ V)} \quad \text{(Eq. 22)}$$

Since nodes $Z_1$ and $Z_2$ are coupled together through switch K, they should have substantially the same voltage (ignoring losses in the switches) at phase V, yielding:

$$C_{u3} \cdot V_{Z(Phase\ IV)} = (C_{u3}+C_{u4})\cdot V_{Z1(Phase\ V)} = (C_{u3}+C_{u4})\cdot V_{Z2(Phase\ V)} \quad \text{(Eq. 23)}$$

Solving for $V_{Z1(phase\ V)}$:

$$V_{Z1(phase\ V)} = V_{Z2(phase\ V)} = V_{Z1(Phase\ IV)}\cdot C_{u3}/(C_{u3}+C_{u4}) \quad \text{(Eq. 24)}$$

Substituting Eq. 12 yields:

$$V_{Z1(Phase\ V)} = V_{REF1}\cdot C_{u1}\cdot C_{u2}\cdot C_{u3}/\{(C_{u1}+C_{u2})\cdot(C_{u2}+C_{u3})\cdot(C_{u3}+C_{u4})\} \quad \text{(Eq. 25)}$$

In some embodiments, where the capacitors $C_{u3}$ and $C_{u4}$ have the same capacitance value C, the charges $Q_{Cu3}$ originally stored on the capacitor $C_{u3}$ at phase IV is equally redistributed at phase V to capacitors $C_{u3}$ and $C_{u4}$ through switch K. For this example, the charges $Q_{Cu3}$ and $Q_{Cu4}$ stored on capacitors $C_{u3}$ and $C_{u4}$, respectively, at phase V are given as:

$$Q_{Cu4(Phase\ V)} = Q_{Cu3(Phase\ V)} = (1/2)\cdot Q_{u3(Phase\ IV)} = (1/2)\cdot C \cdot V_{Z1(Phase\ IV)} \quad \text{(Eq. 26)}$$

Assuming that all of the capacitors have equal values, $C_{u1} = C_{u2} = C_{u3} = C_{u4} = C$, Eq. 25 at phase V can be rewritten as:

$$V_{Z1(Phase\ V)} = (1/8)\cdot V_{REF1} \quad \text{(Eq. 27)}$$

At phase VI of FIG. 2A, switches B, D, and H are operated in a closed position while the remaining switches are operated in an opened position. Since switch M is closed, node $Z_1$ is coupled to node W and capacitor $C_{u3}$ effectively maintains the voltage ($V_W$) at node W, which can be given as:

$$V_{W(Phase\ IV)} = V_{Z1(Phase\ V)} = (1/8)\cdot V_{REF1} \quad \text{(Eq. 28)}$$

In the example embodiment set forth above, the switches are assumed to inject negligible amount of charges on the capacitor array when they are operated in a closed position. Therefore, switch K is configured to be operated in an opened position. In some other embodiments, to avoid injecting an offset error voltage, switch K may be configured to be operated in a closed position.

A comparator is configured to compare the second reference voltage $V_{REF2}$, which corresponds to the voltage ($V_W$) at node W, against the analog input voltage $V_{IN}$. A digital output bit $S_2$ may be generated based on the comparison. For example, when the analog input voltage $V_{IN}$ is greater than the second reference voltage $V_W$, then $S_2$ has a value corresponding to "Logic 1" or the equivalent signal level (e.g., a high voltage supply level such as VDD or 5V, etc.). When the analog input voltage $V_{IN}$ is less than the second reference voltage $V_W$, then $S_2$ has a value corresponding to "Logic 0" or the equivalent signal level (e.g., a low supply voltage such as VSS or −5V for dual supply systems, or a circuit ground level such as 0V for single supply voltage systems).

Figure 2B:
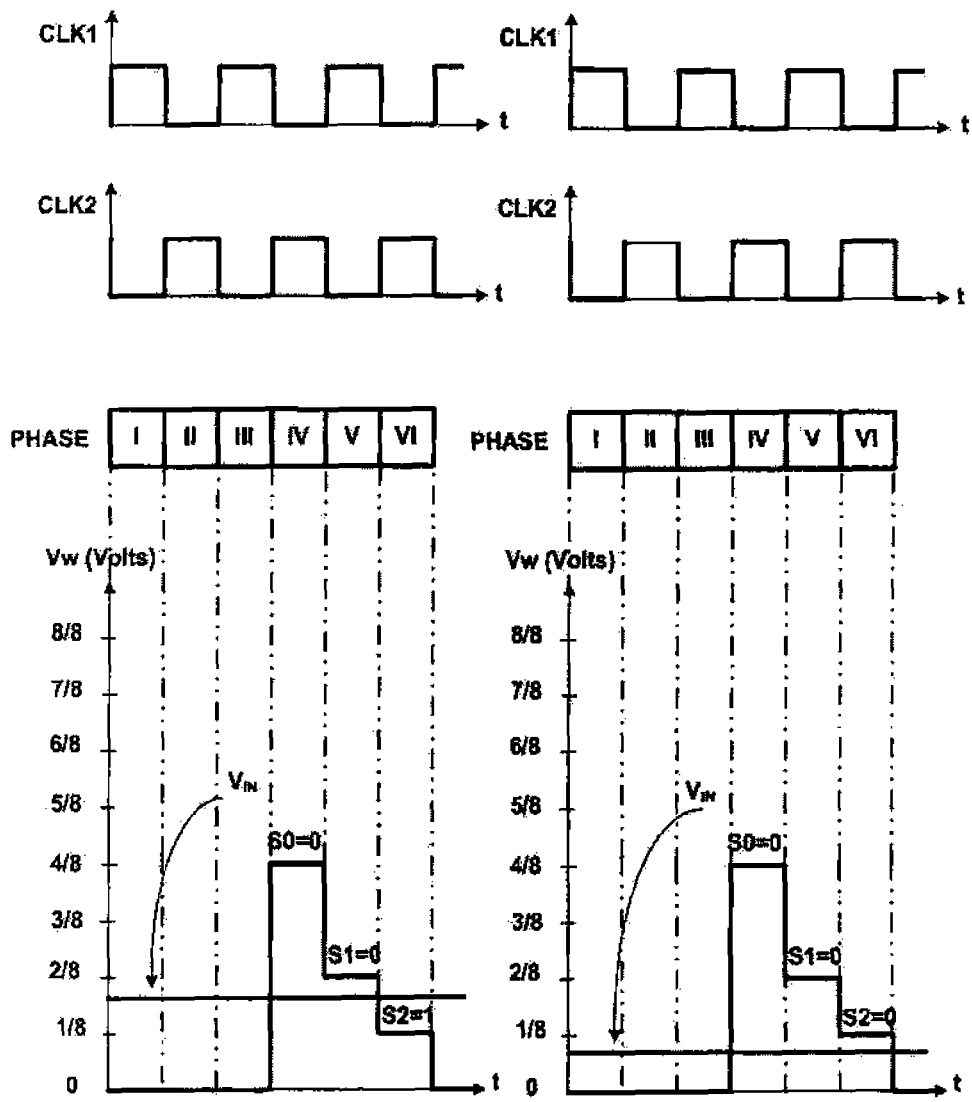
FIG. 2B shows a transient response of an example conversion using the switching sequence shown in Table 1.

The first switching sequence described in FIG. 2A may result in an output of two sets of 3-bit digital outputs. FIG. 2B shows a transient response of an example conversion using the switching sequence shown in Table 1, in accordance with at least some embodiments described herein. In FIG. 2B, $CLK_1$ refers to a first clock signal and $CLK_2$ refers to a second clock signal. $CLK_1$ and $CLK_2$ are square wave signals which are alternately fed to the control block 105 of a successive approximation register ADC as described herein. Each rising edge, falling edge or level associated with square waves of $CLK_1$ and/or $CLK_2$ may be utilized by control block 105 to open or to close specific switches in a unit capacitor array 103 of the successive approximation register ADC. As set forth above, the switching sequence shown in Table 1 may generate values of the reference voltage ($V_W$) at node W of "0" at phase I, "0" at phase II, "0" at phase III, "($\frac{1}{2}$)·$V_{REF1}$" at phase IV, "($\frac{1}{4}$)·$V_{REF1}$" at phase V, and "($\frac{1}{8}$)·$V_{REF1}$" at phase VI.

When the analog input voltage ($V_{IN}$) is between 0 and ($\frac{1}{8}$)·$V_{REF1}$, the analog input voltage $V_{IN}$ is compared with ($\frac{1}{2}$)·$V_{REF1}$, ($\frac{1}{4}$)·$V_{REF1}$, and ($\frac{1}{8}$)·$V_{REF1}$, at a respective one of phase VI, phase V, and phase VI. A 3-bit digital output (0, 0, 0) may be generated based on the three comparison results as set forth above.

When the analog input voltage $V_{IN}$ is between ($\frac{1}{8}$)·$V_{REF1}$ and ($\frac{2}{8}$)·$V_{REF1}$, the analog input voltage $V_{IN}$ is compared with ($\frac{1}{2}$)·$V_{REF1}$, ($\frac{1}{4}$)·$V_{REF1}$, and ($\frac{1}{8}$)·$V_{REF1}$, at a respective one of phase VI, phase V, and phase VI. A 3-bit digital output (0, 0, 1) may be generated based on the three comparison results as set forth above.

In accordance with alternative embodiments of the present disclosure, the switches may be opened/closed in other ways in a phase, as long as the voltages at nodes in the phase are unaffected. For example, in phase II, switch G may be operated in an opened position, as long as the voltages at nodes $X_1$ and node $X_2$ are the same as the voltages at the same two nodes when switch G is operated in a closed position.

A second switching sequence is further described below.

Table 2 shows the second switching sequence of the twelve switches A, B, C, D, E, F, G, H, I, J, K, and L for a series of example operating phases I-VI. The number "1" in a cell means that the switch corresponding to the cell is closed. The number "0" in a cell means that the switch corresponding to the cell is opened. The second switching sequence is substantially the same as the first switching sequence except at phase VI.

TABLE 2

| Phase | A | B | C | D | E | F | G | H | I | J | K | L |
|---|---|---|---|---|---|---|---|---|---|---|---|---|
| I | 0 | 1 | 1 | 1 | 0 | 1 | 1 | 0 | 0 | 1 | 1 | 1 |
| II | 1 | 1 | 0 | 1 | 0 | 1 | 1 | 0 | 0 | 1 | 1 | 1 |
| III | 0 | 1 | 1 | 1 | 0 | 0 | 0 | 0 | 0 | 1 | 1 | 1 |
| IV | 0 | 1 | 0 | 1 | 1 | 1 | 0 | 0 | 0 | 0 | 0 | 0 |
| V | 0 | 1 | 0 | 1 | 0 | 0 | 0 | 0 | 1 | 0 | 1 | 0 |
| VI | 0 | 1 | 0 | 0 | 0 | 0 | 0 | 0 | 1 | 1 | 0 | 0 |

Figure 2C:
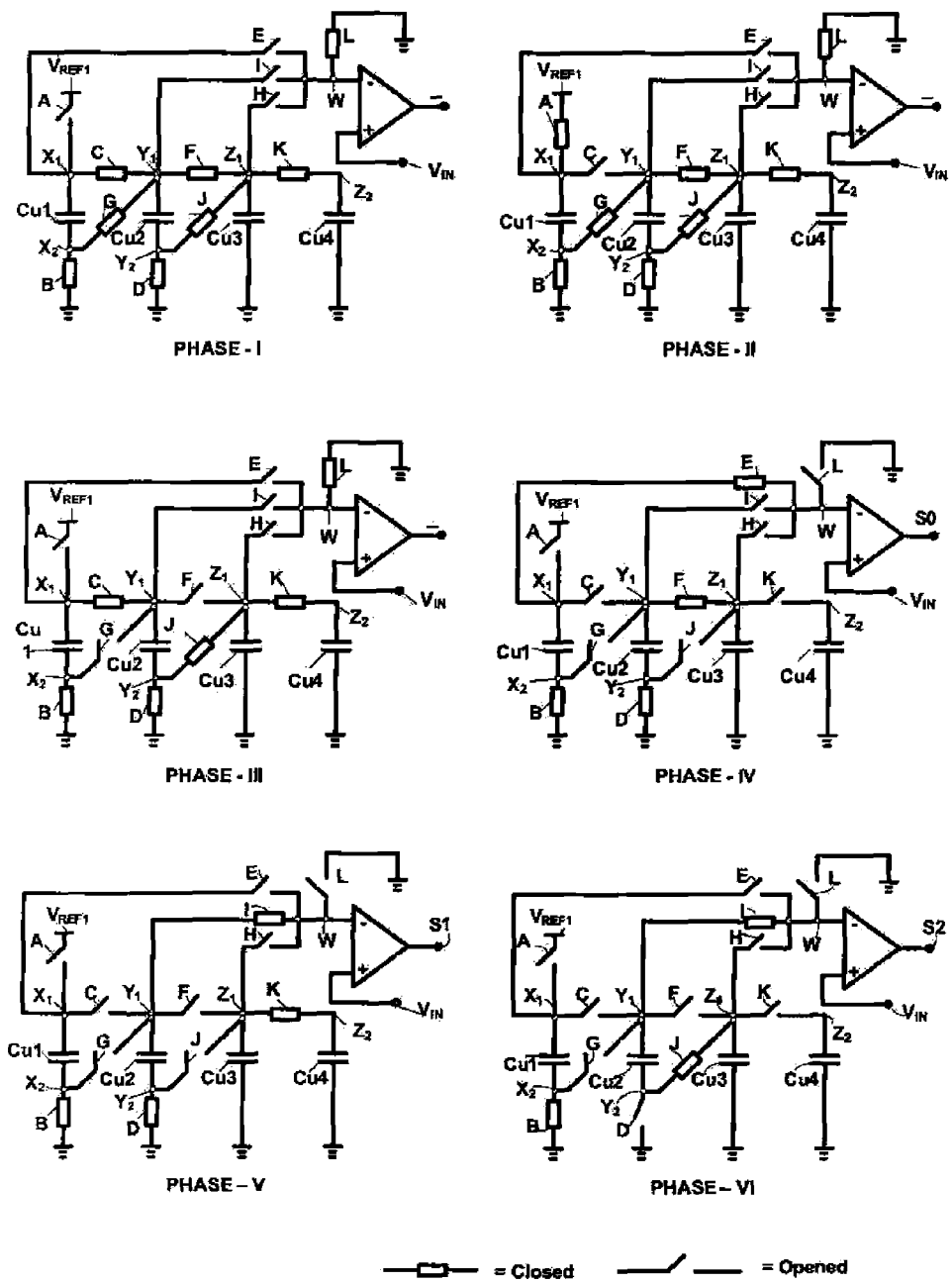
FIG. 2C shows a set of circuit diagrams of an example a unit capacitor array in which switches are configured to carry out the switching sequence shown in Table 2.

FIG. 2C shows a set of circuit diagrams of an example unit capacitor array in which switches are configured to carry out the switching sequence shown in Table 2, in accordance with at least some embodiments described herein. The circuit configuration shown in FIG. 2C is substantially similar to that shown in FIG. 2A, with some differences concerning the operation of the switching of the unit capacitors.

In conjunction with FIG. 2A and the descriptions associated with FIG. 2A set forth above, the voltage ($V_W$) at node W is ($\frac{1}{2}$)·$V_{REF1}$ at phase IV. At phase V, $V_W$ and $V_{Y1}$ have the same value of ($\frac{1}{4}$)·$V_{REF1}$. In addition, $V_{Z1}$ is ($\frac{1}{8}$)·$V_{REF1}$ at phase V.

At phase VI of FIG. 2C, switches B, I, and J are operated in a closed position while the remaining switches are operated in an opened position. In phase VI, the switch J is configured to provide a series coupling for the capacitors $C_{u2}$ and $C_{u3}$. Therefore, the voltage ($V_W$) at node W as depicted in FIG. 2C at phase VI is given as:

$$V_{W(phase\ VI)} = V_{Y1(phase\ VI)} = V_{Y1(phase\ V)} + V_{Z1(phase\ V)} = (\tfrac{1}{4})\cdot V_{REF1} + (\tfrac{1}{8})\cdot V_{REF1} = (\tfrac{3}{8})\cdot V_{REF1},$$

$V_{Y1(phase\ VI)}$ refers to voltage $V_{Y1}$ at phase VI, $V_{Y1(phase\ V)}$ refers to voltage $V_{Y1}$ at phase V, and $V_{Z1(phase\ V)}$ refers to voltage $V_{Z1}$ at phase V.

Figure 2D:
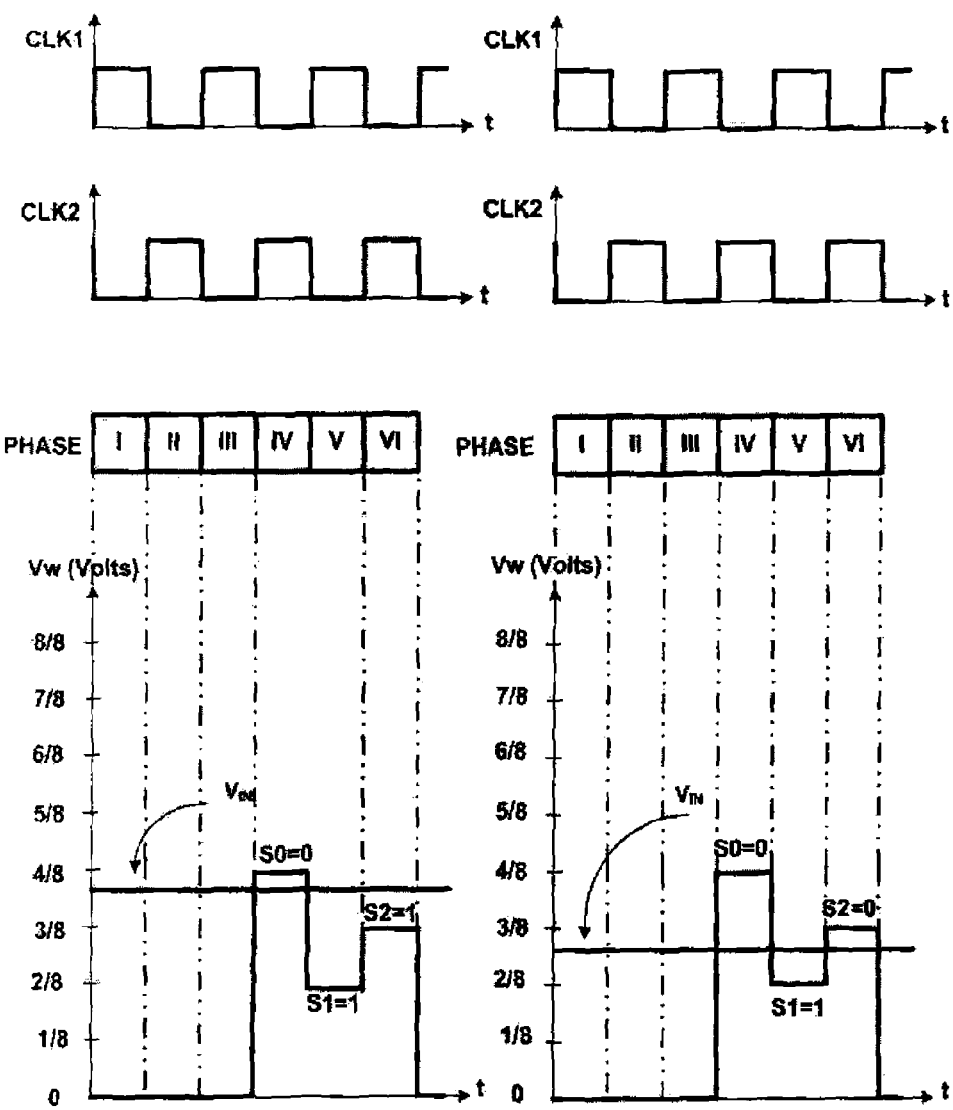
FIG. 2D shows a transient response of an example conversion using the switching sequence shown in Table 2.

The second switching sequence described in FIG. 2C may result in an output of two sets of 3-bit digital outputs. FIG. 2D shows a transient response of an example conversion using the switching sequence shown in Table 2, in accordance with at least some embodiments described herein. In FIG. 2D, $CLK_1$ refers to a first clock signal and $CLK_2$ refers to a second clock signal. $CLK_1$ and $CLK_2$ are square wave signals which are alternately fed to a control block (e.g., the control block 105) of a successive approximation register ADC as described herein. Each rising edge, falling edge or level associated with square wave of $CLK_1$ and/or $CLK_2$ may be utilized by the control block to dynamically control the operation of specific switches in a unit capacitor array (e.g., the unit capacitor array 103) of the successive approximation register ADC. As set form above, the switching sequence shown in Table 2 may generate values of the reference voltage ($V_W$) at node W of "0" at phase I, "0" at phase II, "0" at phase III, "($\frac{1}{2}$)·$V_{REF1}$" at phase IV, "($\frac{1}{4}$)·$V_{REF1}$" at phase V, and "($\frac{3}{8}$)·$V_{REF1}$" at the phase VI.

When the analog input voltage ($V_{IN}$) is between ($\frac{2}{8}$)·$V_{REF1}$ and ($\frac{3}{8}$)·$V_{REF1}$, the analog input voltage ($V_{IN}$) is compared with ($\frac{1}{2}$)·$V_{REF1}$, ($\frac{1}{4}$)·$V_{REF1}$, and ($\frac{3}{8}$)·$V_{REF1}$, at a respective one of phase IV, phase V, and phase VI. A 3-bit digital output (0, 1, 0) may be generated based on the three comparison results as set forth above.

When the analog input voltage ($V_{IN}$) is between ($\frac{3}{8}$)·$V_{REF1}$ and ($\frac{4}{8}$)·$V_{REF1}$, the analog input voltage ($V_{IN}$) is compared with ($\frac{1}{2}$)·$V_{REF1}$, ($\frac{1}{4}$)·$V_{REF1}$, and ($\frac{3}{8}$)·$V_{REF1}$, at a respective one of phase IV, phase V, and phase VI. A 3-bit digital output (0, 1, 1) may be generated based on the three comparison results as set forth above.

A third switching sequence is further described below.

Table 3 shows the third switching sequence of the twelve switches A, B, C, D, E, F, G, H, I, J, K, and L for a series of example operating phases I-VI. The number "1" in a cell means that the switch corresponding to the cell is closed. The number "0" in a cell means that the switch corresponding to the cell is opened. The third switching sequence is substantially the same as the first switching sequence except at phase V and phase VI.

TABLE 3

| Phase | A | B | C | D | E | F | G | H | I | J | K | L |
|---|---|---|---|---|---|---|---|---|---|---|---|---|
| I | 0 | 1 | 1 | 1 | 0 | 1 | 1 | 0 | 0 | 1 | 1 | 1 |
| II | 1 | 1 | 0 | 1 | 0 | 1 | 1 | 0 | 0 | 1 | 1 | 1 |
| III | 0 | 1 | 1 | 1 | 0 | 0 | 0 | 0 | 0 | 1 | 1 | 1 |

TABLE 3-continued

| Phase | A | B | C | D | E | F | G | H | I | J | K | L |
|-------|---|---|---|---|---|---|---|---|---|---|---|---|
| IV    | 0 | 1 | 0 | 1 | 1 | 1 | 0 | 0 | 0 | 0 | 0 | 0 |
| V     | 0 | 0 | 0 | 1 | 1 | 0 | 1 | 0 | 0 | 0 | 1 | 0 |
| VI    | 0 | 0 | 0 | 0 | 1 | 1 | 1 | 0 | 0 | 0 | 0 | 0 |

Figure 2E:
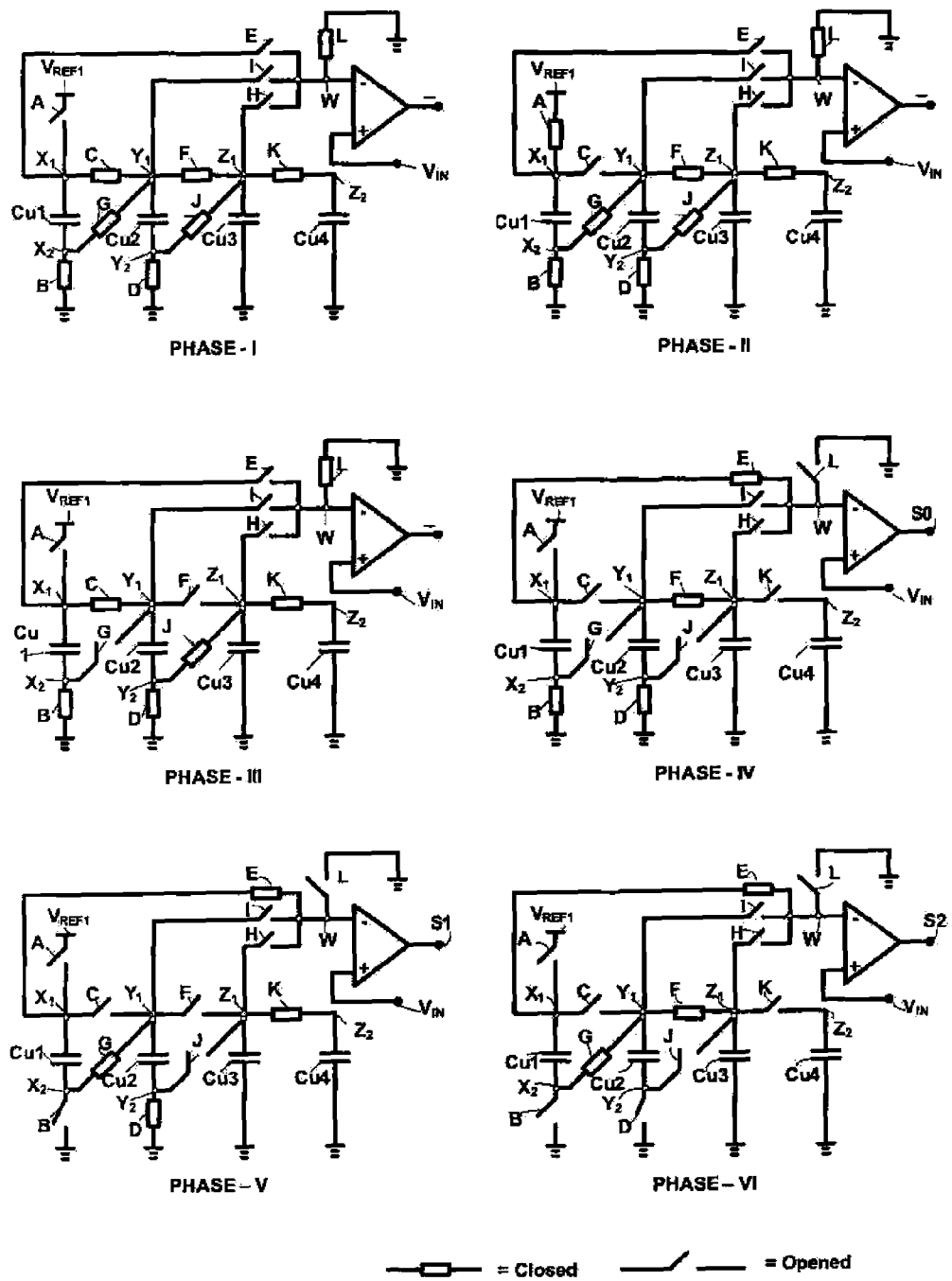
FIG. 2E shows a set of circuit diagrams of an example unit capacitor array in which switches are configured to carry out the switching sequence shown in Table 3.

FIG. 2E shows a set of circuit diagrams of an example unit capacitor array in which switches are configured to carry out the switching sequence shown in Table 3, in accordance with at least some embodiments described herein. The circuit configuration shown in FIG. 2E is substantially similar to that shown in FIGS. 2A and 2C, with some differences concerning the operation of the switching of the unit capacitors. In conjunction with FIG. 2A and the descriptions associated with FIG. 2A set forth above, the voltage ($V_W$) at node W is $(1/2) \cdot V_{REF1}$ at phase IV. In addition, voltages $V_{X1}$, $V_{Y1}$, and $V_{Z1}$ at node X1, Y1, and Z1 are $(1/2) \cdot V_{REF1}$, $(1/4) \cdot V_{REF1}$ and $(1/4) \cdot V_{REF1}$, respectively, at phase IV.

At phase V of FIG. 2E, switches D, E, G, and K are operated in a closed position while the remaining switches are operated in an opened position. In phase V, switch G is configured to provide a series coupling for capacitors $C_{u1}$ and $C_{u2}$. Therefore, the voltage ($V_W$) at node W as depicted in FIG. 2E at the phase V is given as:

$$V_{W(phase\ V)} = V_{X1(phase\ V)} = V_{X1(phase\ IV)} + V_{Y1(phase\ IV)} = (1/2) \cdot V_{REF1} + (1/4) \cdot V_{REF1} = (3/4) \cdot V_{REF1},$$

where $V_{X1(phase\ V)}$ refers to voltage $V_{X1}$ at phase V, $V_{X1(phase\ IV)}$ refers to voltage $V_{X1}$ at phase IV, and $V_{Y1(phase\ IV)}$ refers to voltage $V_{Y1}$ at phase IV.

Also at phase V, switch K is operated in a closed position. Therefore, the charges originally stored in the capacitor $C_{u3}$ at phase IV may be re-distributed to capacitors $C_{u3}$ and $C_{u4}$. In some examples, where the capacitors $C_{u3}$ and $C_{u4}$ have the same capacitance value C, the charges originally stored on the capacitor $C_{u3}$ at phase IV is equally re-distributed to the capacitors $C_{u3}$ and $C_{u4}$ through switch K. For this example, the resulting voltage ($V_{Z1}$) at the node $Z_1$ as depicted in FIG. 2E at phase V is given as:

$$V_{Z1(phase\ V)} = (1/2) * V_{Z1(phase\ IV)} = (1/8) * V_{REF1}$$

At phase VI, switches E, F, and G are operated in a closed position while the remaining switches are operated in an opened position. The switches F and G are configured to provide a series coupling for the capacitors $C_{u1}$ and $C_{u3}$. Therefore, the resulting voltage ($V_W$) at node W as depicted in FIG. 2E at phase VI is given as:

$$V_{W(phase\ VI)} = V_{X1(phase\ VI)} = V_{X1(phase\ IV)} + V_{Z1(phase\ V)} = (1/2) \cdot V_{REF1} + (1/8) \cdot V_{REF1} = (5/8) \cdot V_{REF1},$$

where $V_{W(phase\ VI)}$ refers to voltage $V_{X1}$ at phase VI, $V_{X1(phase\ IV)}$ refers to voltage $V_{X1}$ at phase IV, and $V_{Z1(phase\ V)}$ refers to voltage $V_{Z1}$ at phase V.

Figure 2F:
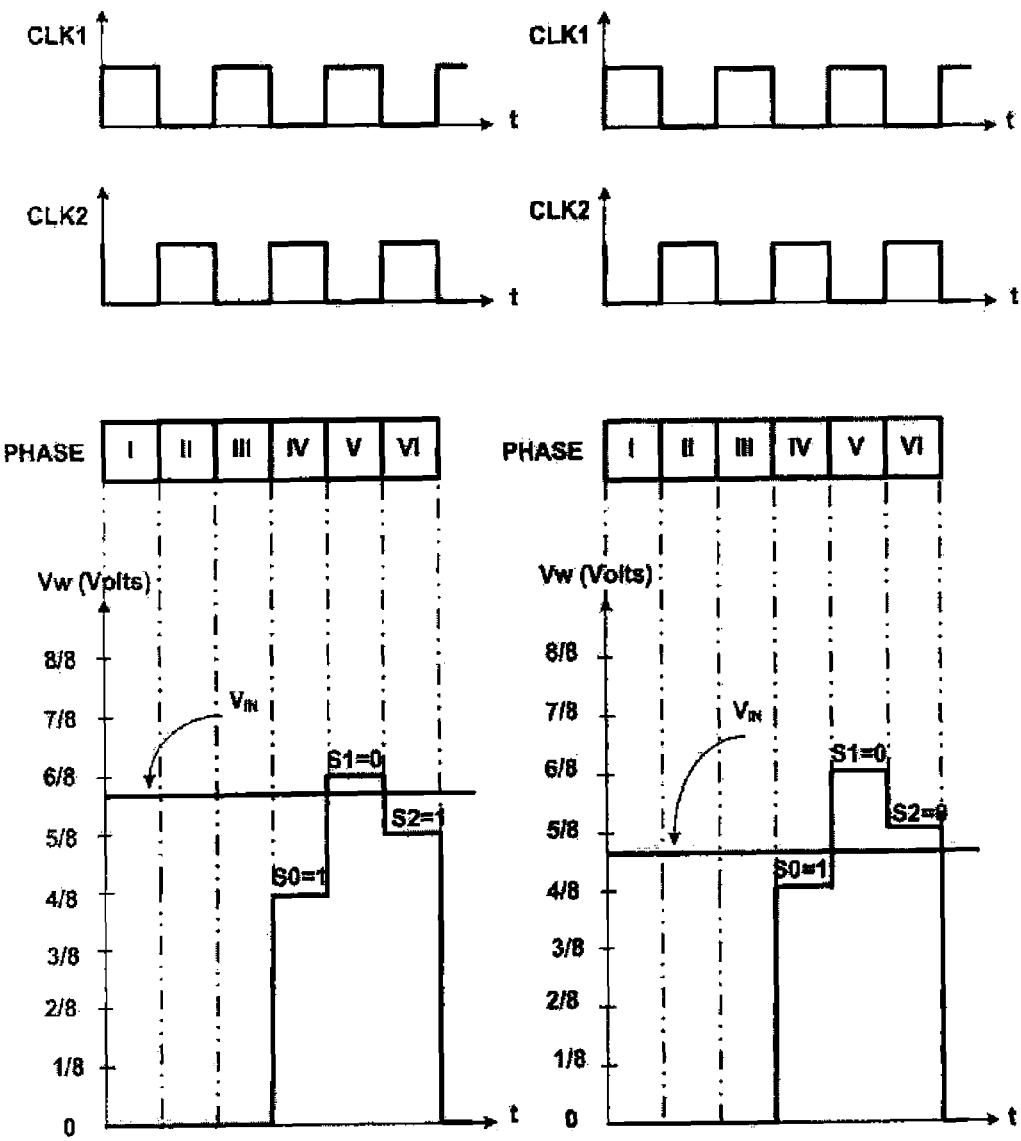
FIG. 2F shows a transient response of an example conversion using the switching sequence shown in Table 3.

The third switching sequence described in FIG. 2E may result in an output of two sets of 3-bit digital outputs. FIG. 2F shows a transient response of an example conversion using the switching sequence shown in Table 3, in accordance with at least some embodiments described herein. In FIG. 2F, $CLK_1$ refers to a first clock signal and $CLK_2$ refers to a second clock signal. $CLK_1$ and $CLK_2$ are square wave signals which are alternately fed to a control block (e.g., the control block 105) of a successive approximation register ADC. Each rising edge, falling edge or level associated with square wave of $CLK_1$ and/or $CLK_2$ may be utilized by the control block to dynamically control the operation of specific switches in a unit capacitor array (e.g., the unit capacitor array 103) of the successive approximation register ADC. As set forth above, the switching sequence shown in Table 3 may generate values of the reference voltage ($V_W$) at node W of "0" at phase I, "0" at phase II, "0" at phase III, "$(1/2) \cdot V_{REF1}$" at phase IV, "$(3/4) \cdot V_{REF1}$" at phase V, and "$(5/8) \cdot V_{REF1}$" at phase VI.

When the analog input voltage ($V_{IN}$) is between $(4/8) \cdot V_{REF1}$ and $(5/8) \cdot V_{REF1}$, the analog input voltage ($V_{IN}$) is compared with $(1/2) \cdot V_{REF1}$, $(3/4) \cdot V_{REF1}$, and $(5/8) \cdot V_{REF1}$, at a respective one of phase IV, phase V, and phase VI. A 3-bit digital output (1, 0, 0) may be generated based on the three comparison results as set forth above.

When the analog input voltage ($V_{IN}$) is between $(5/8) \cdot V_{REF1}$ and $(6/8) \cdot V_{REF1}$, the analog input voltage is compared with $(1/2) \cdot V_{REF1}$, $(3/4) \cdot V_{REF1}$, and $(5/8) \cdot V_{REF1}$, at a respective one of phase IV, phase V, and phase VI. A 3-bit digital output (1, 0, 1) may be generated based on the three comparison results as set forth above.

A fourth switching sequence is further described below.

Table 4 shows the fourth switching sequence of the twelve switches A, B, C, D, E, F, G, H, I, J, K, and L for a series of example operating phases I-VI. The number "1" in a cell means that the switch corresponding to the cell is closed. The number "0" in a cell means that the switch corresponding to the cell is opened. The fourth switching sequence is substantially the same as the first switching sequence except at phase V and phase VI.

TABLE 4

| Phase | A | B | C | D | E | F | G | H | I | J | K | L |
|-------|---|---|---|---|---|---|---|---|---|---|---|---|
| I     | 0 | 1 | 1 | 1 | 0 | 1 | 1 | 0 | 0 | 1 | 1 | 1 |
| II    | 1 | 1 | 0 | 1 | 0 | 1 | 1 | 0 | 0 | 1 | 1 | 1 |
| III   | 0 | 1 | 1 | 1 | 0 | 0 | 0 | 0 | 0 | 1 | 1 | 1 |
| IV    | 0 | 1 | 0 | 1 | 1 | 1 | 0 | 0 | 0 | 0 | 0 | 0 |
| V     | 0 | 0 | 0 | 1 | 1 | 0 | 1 | 0 | 0 | 0 | 1 | 0 |
| VI    | 0 | 0 | 0 | 0 | 1 | 0 | 1 | 0 | 0 | 1 | 0 | 0 |

Figure 2G:
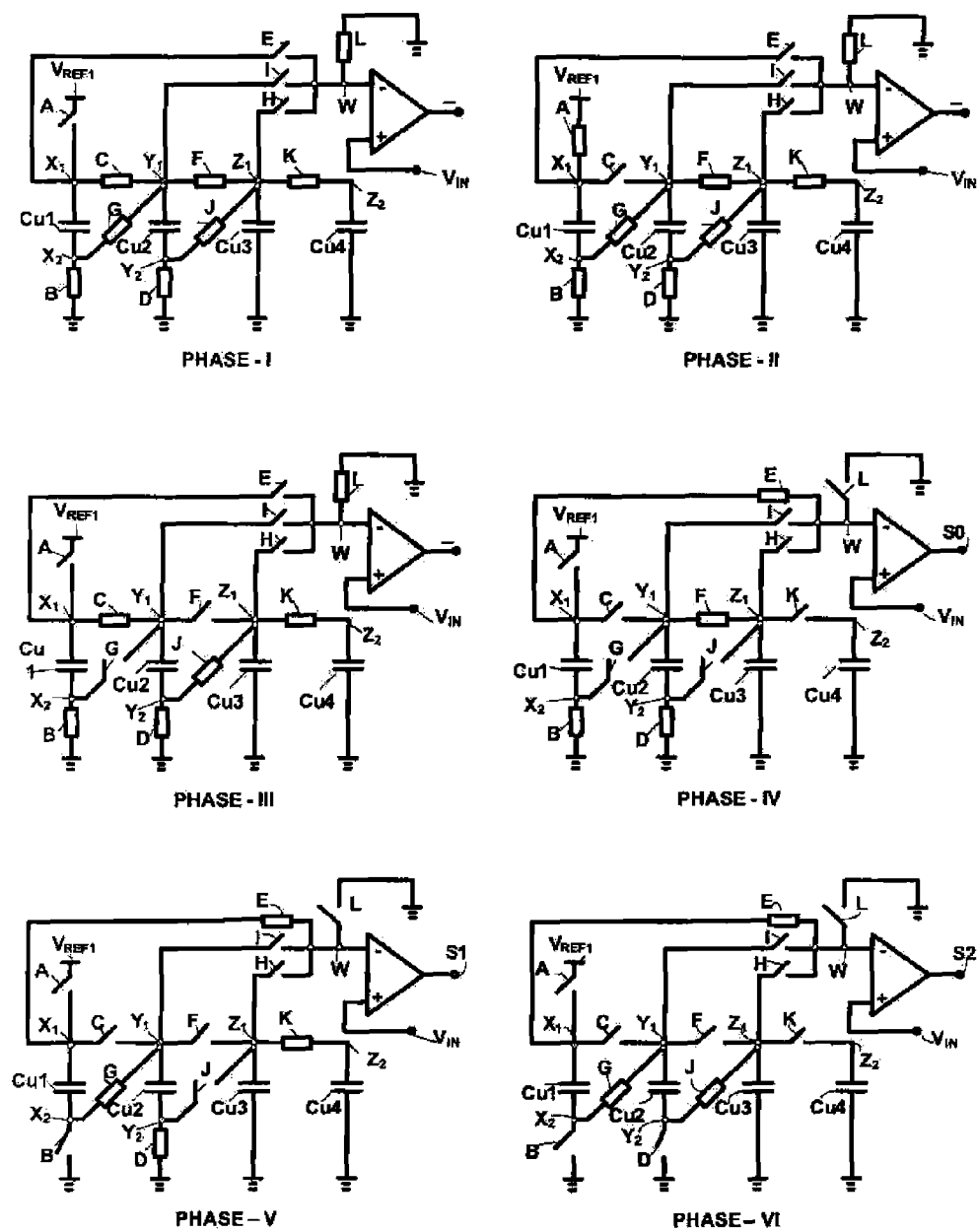
FIG. 2G shows a set of circuit diagrams of an example unit capacitor array in which switches are configured to carry out the switching sequence shown in Table 4.

FIG. 2G shows a set of circuit diagrams of an example unit capacitor array in which switches are configured to carry out the switching sequence shown in Table 4, in accordance with at least some embodiments described herein. The circuit configuration shown in FIG. 2G is substantially similar to that shown in FIGS. 2A, 2C, and 2E, with some differences concerning the operation of the switching of the unit capacitors. In conjunction with FIG. 2A and the descriptions associated with FIG. 2A set forth above, the voltage ($V_W$) at node W is $(1/2) \cdot V_{REF1}$ at phase IV. In addition, voltages $V_{X1}$, $V_{Y1}$, and $V_{Z1}$ at node X1, Y1, and Z1 are $(1/2) \cdot V_{REF1}$, $(1/4) \cdot V_{REF1}$ and $(1/4) \cdot V_{REF1}$, respectively, at phase IV.

At phase V of FIG. 2G, switches D, E, G, and K are operated in a closed position while the remaining switches are operated in an opened position. In phase V, switch G is configured to provide a series coupling for capacitors $C_{u1}$ and $C_{u2}$. Therefore, the voltage ($V_W$) at node W as depicted in FIG. 2G at the phase V is given as:

$$V_{W(phase\ V)} = V_{X1(phase\ V)} = V_{X1(phase\ IV)} + V_{Y1(phase\ IV)} = (1/2) \cdot V_{REF1} + (1/4) \cdot V_{REF1} = (3/4) \cdot V_{REF1},$$

where $V_{X1(phase\ V)}$ refers to voltage $V_{X1}$ at phase V, $V_{X1(phase\ IV)}$ refers to voltage $V_{X1}$ at phase IV, and $V_{Y1(phase\ IV)}$ refers to voltage $V_{Y1}$ at phase IV.

Also at phase V, switch K is operated in a closed position. Therefore, the charges originally stored in the capacitor $C_{u3}$ at phase IV may be re-distributed to capacitors $C_{u3}$ and $C_{u4}$. In some examples, where the capacitors $C_{u3}$ and $C_{u4}$ have the same capacitance value C, the charges originally stored oh the capacitor $C_{u3}$ at phase IV is equally re-distributed to the capacitors $C_{u3}$ and $C_{u4}$ through switch K. For this example, the resulting voltage ($V_{Z1}$) at the node $Z_1$ as depicted in FIG. 2E at phase V is given as:

$$V_{Z1(phase\ V)} = (1/2) * V_{Z1(phase\ IV)} = (1/8) * V_{REF1}$$

At phase VI, switches E, J, and G are operated in a closed position while the remaining switches are operated in an opened position. The switches J and G are configured to provide a series coupling for the capacitors $C_{u1}$, $C_{u2}$, and $C_{u3}$. Therefore, the resulting voltage ($V_W$) at the node W as depicted in FIG. 2G at phase VI is given as:

$$V_{W(phase\ VI)} = V_{X1(phase\ VI)} = V_{X1(phase\ IV)} + V_{Y1(phase\ IV)} + V_{Z1(phase\ V)} = (1/2) \cdot V_{REF1} + (1/4) \cdot V_{REF1} + (1/8) \cdot V_{REF1} = (7/8) \cdot V_{REF1},$$

where $V_{X1(phase\ VI)}$ refers to voltage $V_{X1}$ at phase VI, $V_{Z1(phase\ IV)}$ refers to voltage $V_{X1}$ at phase IV, $V_{Y1(phase\ IV)}$ refers to voltage $V_{Y1}$ at phase IV, and $V_{Z1(phase\ V)}$ refers to voltage $V_{Z1}$ at phase V.

Figure 2H:
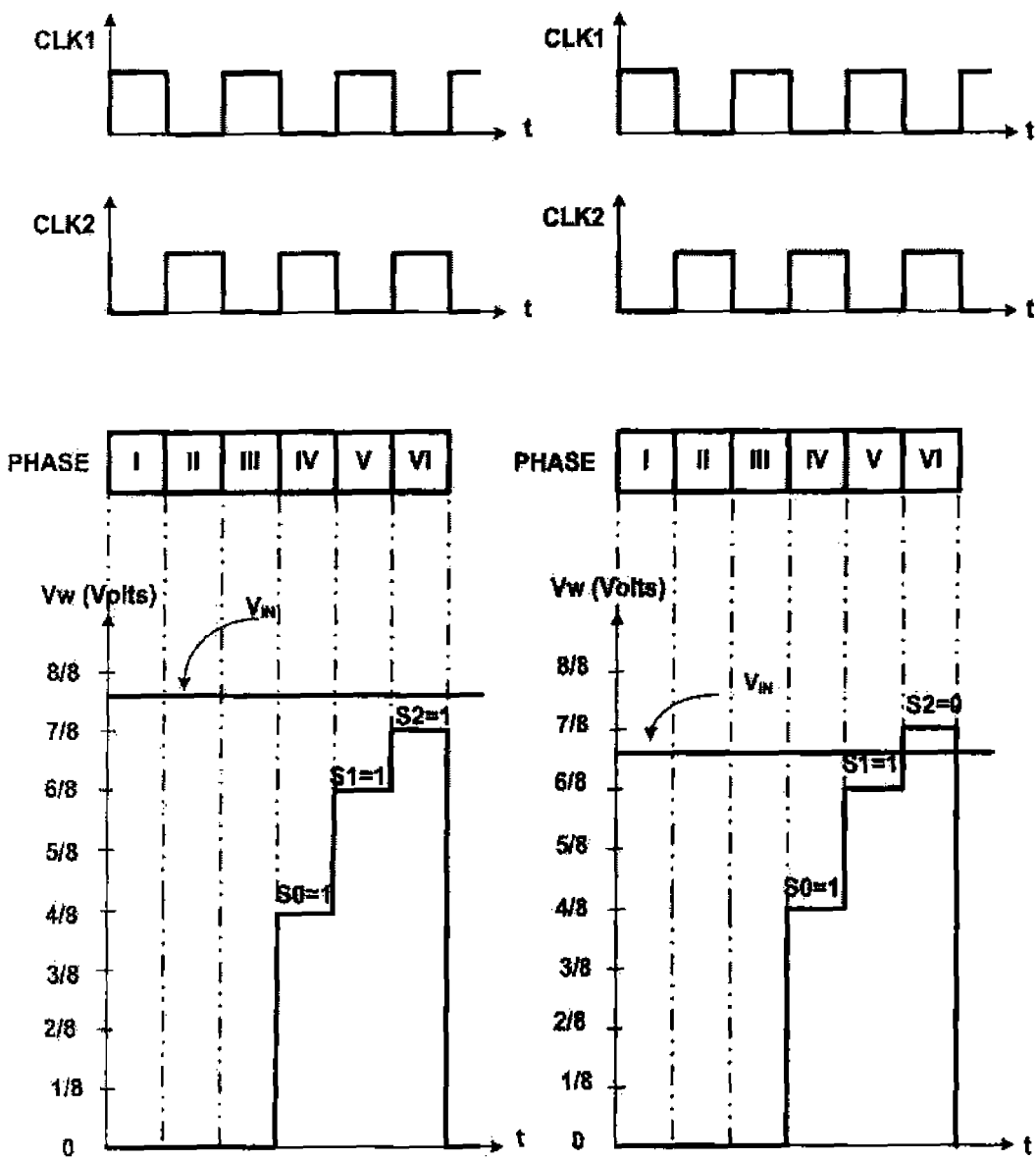
FIG. 2H shows a transient response of an example conversion using the switching sequence shown in Table 4.

The fourth switching sequence described in FIG. 2G may result in an output of two sets of 3-bit digital outputs, FIG. 2H shows a transient response of an example conversion using the switching sequence shown in Table 4, in accordance with at least some embodiments described herein. In FIG. 2H, $CLK_1$ refers to a first clock signal and $CLK_2$ refers to a second clock signal. $CLK_1$ and $CLK_2$ are square wave signals which are alternately fed to a control block (e.g., the control block 105) of a successive approximation register ADC. Each rising edge, falling edge of level associated with square wave of $CLK_1$ and/or $CLK_2$ may be utilized by the control block to dynamically control the operation of specific switches in a unit capacitor array (e.g., the unit capacitor array 103) of the successive approximation register ADC. As set forth above, the switching sequence shown in Table 4 may generate values of the reference voltage ($V_W$) at node W of "0" at phase I, "0" at phase II, "0" at phase III, "(1/2)·$V_{REF1}$" at phase IV, "(3/4)·$V_{REF1}$" at phase V, and "(7/8)·$V_{REF1}$" at phase VI.

When the analog input voltage ($V_{IN}$) is between (6/8)·$V_{REF1}$ and (7/8)·$V_{REF1}$, the analog input voltage ($V_{IN}$) is compared with (1/2)·$V_{REF1}$, (3/4)·$V_{REF1}$, and (7/8)·$V_{REF1}$, at a respective one of phase IV, phase V, and phase VI. A 3-bit digital output (1, 1, 0) may be generated based on the three comparison results as set forth above.

When the analog input voltage ($V_{IN}$) is between (7/8)·$V_{REF1}$ and $V_{REF1}$, the analog input voltage is compared with (1/2)·$V_{REF1}$, (3/4)·$V_{REF1}$, and (7/8)·$V_{REF1}$, at a respective one of phase IV, phase V, and phase VI. A 3-bit digital output (1, 1, 1) may be generated based on the three comparison results as set forth above.

Figure 3:
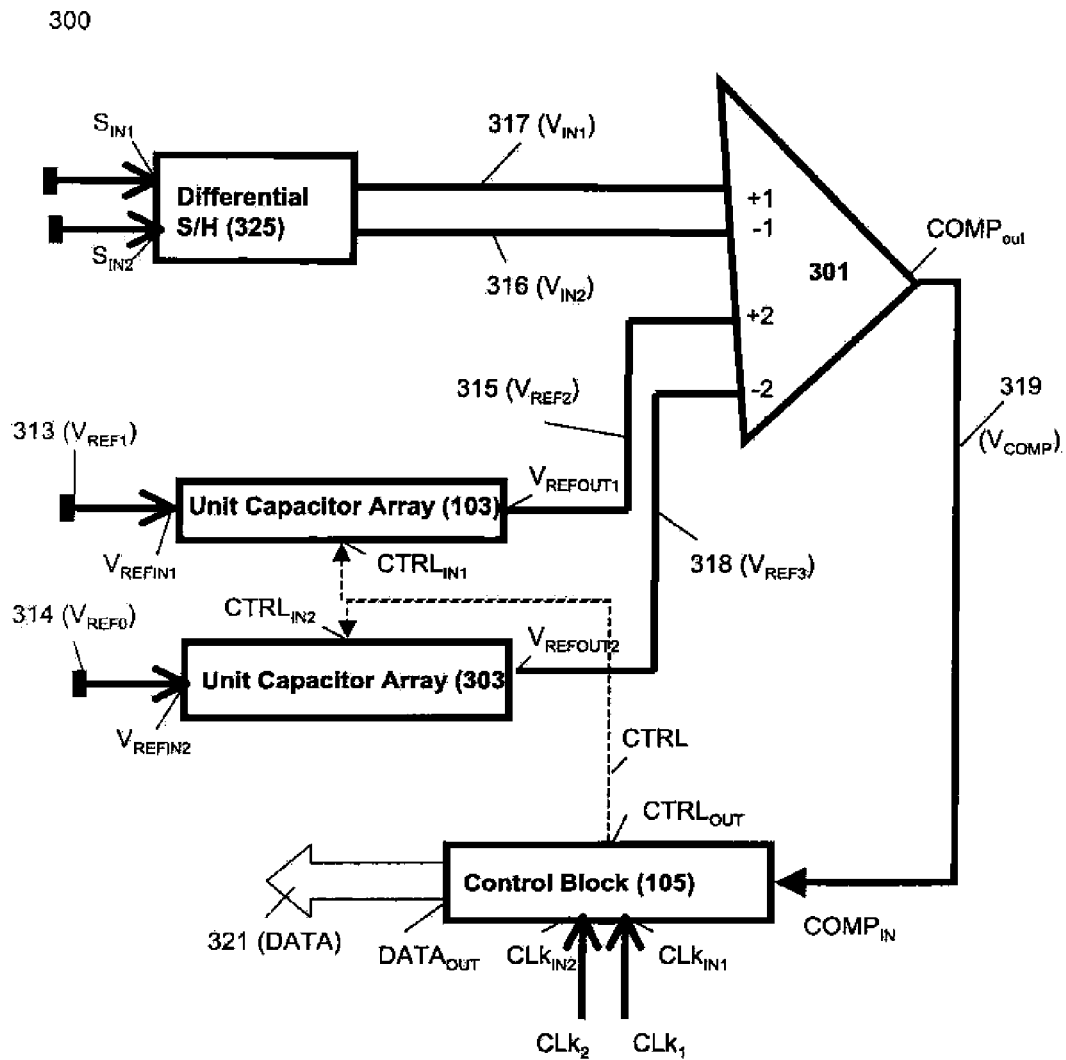
FIG. 3 shows a circuit diagram of an example successive approximation register ADC.

In some embodiments, the successive approximation register ADC set forth above may be implemented in a differential way. FIG. 3 shows a circuit diagram of an example successive approximation register ADC 300 that is arranged in accordance with at least some embodiments described herein.

The ADC 300 includes a differential difference comparator 301, a first unit capacitor array 103, a second unit capacitor array 303, a control block 105, and a differential sample and hold (S/H) circuit 325. The differential difference comparator 301 includes a first input terminal (+1), a second input terminal (−1), a third input terminal (+2), a fourth input terminal (−2), and an output terminal (COMP$_{OUT}$). The first unit capacitor array 103 includes a first reference input terminal ($V_{REFIN1}$), a first control input terminal (CTRL$_{IN1}$), and a first reference output terminal (e.g., $V_{REFOUT1}$). The second unit capacitor array 303 includes a second reference input terminal ($V_{REFIN2}$), a second control input terminal (CTRL$_{IN2}$), and a second reference output terminal (e.g., $V_{REFOUT2}$) The differential S/H circuit 325 includes two input terminals (S$_{IN1}$ and S$_{IN2}$) and two output terminals (S$_{OUT1}$ and S$_{OUT2}$).

In some embodiments, the first unit capacitor array 103 and the control block 105 of FIG. 3 correspond to the unit capacitor array 103 and the control block 105 of FIG. 1A and support the same functions and operations as discussed above.

The differential S/H circuit 325 is configured to receive two signals to be sampled from the first input terminal (S$_{IN1}$) and the second input terminal (S$_{IN2}$), and output the respective first analog input voltage ($V_{IN1}$, 317) and second analog input voltage ($V_{IN2}$, 316). The first analog input voltage ($V_{IN1}$, 317) and the second analog input voltage ($V_{IN2}$, 316) are coupled to the first input terminal (+1) and the second input terminal (−1) of the differential difference comparator 301, respectively. The third input terminal (+2) of the differential difference comparator 301, which corresponds to a first reference voltage ($V_{REF2}$, 315), is coupled to the first output terminal ($V_{REFOUT1}$) of the first unit capacitor array 103. The fourth input terminal (−2) of the differential difference comparator 301, which corresponds to a second reference voltage ($V_{REF3}$, 318), is coupled to the second output terminal ($V_{REFOUT2}$) of the second unit capacitor array 303. The differential difference comparator 301 is configured to sum the first analog input voltage ($V_{IN1}$, 317) and second analog input voltage ($V_{IN2}$, 316) and obtain an analog input voltage. In addition, the differential difference comparator 301 is configured to sum the first reference voltage ($V_{REF2}$, 315) and the second reference voltage ($V_{REF3}$, 318) to obtain a reference voltage. The differential difference comparator 301 is further configured to compare the analog input voltage and the reference voltage and obtain a comparison result ($V_{COMP}$, 319).

The output terminal (COMP$_{OUT}$) of the differential difference comparator 301, which corresponds to the comparison result ($V_{COMP}$, 319), is coupled to the input terminal (COMP$_{IN}$) of the control block 105. A first reference voltage ($V_{REF1}$, 313) is coupled to the first reference input terminal ($V_{REFIN1}$) of the first unit capacitor array 103. A second reference voltage ($V_{REF0}$, 314) is coupled to the second reference input terminal ($V_{REFIN2}$) of the second unit capacitor array 303.

The control output terminal (CTRL$_{OUT}$) of the control block 105, which corresponds to a control signal (CTRL), is coupled to me first control input terminal (CTRL$_{IN1}$) of the first unit capacitor array (103) and to the second control input terminal (CTRL$_{IN2}$) of the second unit capacitor array (303). A first clock signal (CLK$_1$) is coupled to a first clock input terminal (CLK$_{IN1}$) of the control block 105 and a second clock signal (CLK$_2$) is coupled to a second clock input terminal (CLK$_{IN2}$) of the control block 105.

Similar to the control block 105 of FIG. 1A, the control block 105 is configured to control switches in the first unit capacitor array 103 based on the first clock signal (CLK$_1$) and the second clock signal (CLK$_2$). The control block 105 may include decision logic that identifies a phase or operating state for the ADC, and dynamically adjusts the control of the switches in the first unit capacitor array 103 and the second unit capacitor array 303 based on the identified phase as set forth above.

The comparison result ($V_{COMP}$, 319) obtained by the differential difference comparator 301 is coupled to the control block 105, which is configured to generate a digital output (DATA, 321) at the conversion output terminal (DATA$_{OUT}$) based on the comparison result ($V_{COMP}$, 319).

Figure 4:
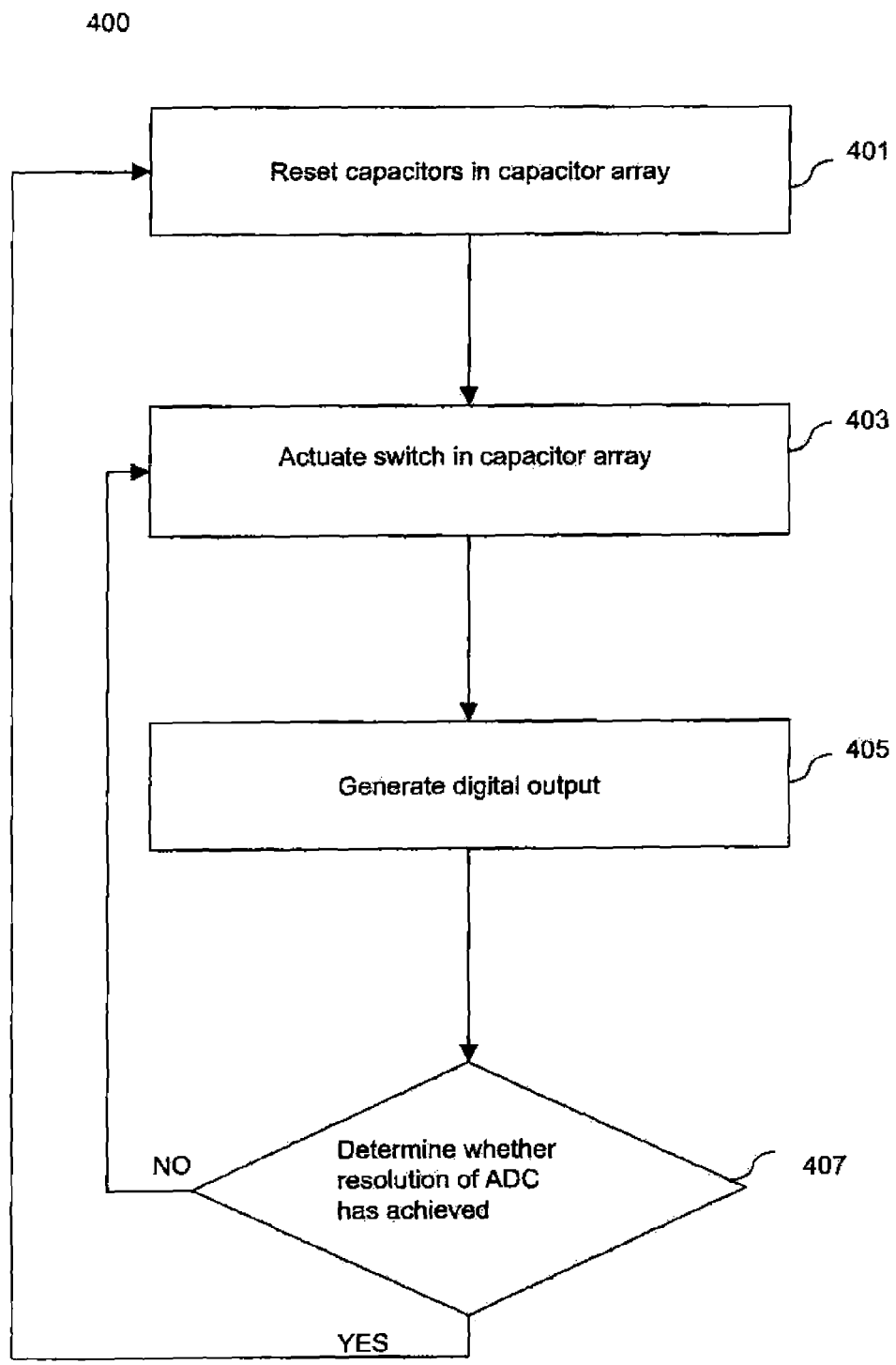
FIG. 4 shows a flow diagram of an example conversion method for a successive approximation register ADC, all arranged in accordance with at least some embodiments described herein.

FIG. 4 sets forth a flow diagram of an example conversion method 400 for a successive approximation register ADC, in accordance with at least some embodiments described herein.

For ease of description, method 400 is described in terms of an analog to digital converter substantially similar to an analog to digital converter in FIGS. 1A and 1B. However, other configurations of analog to digital converter may also perform method 400. Method 400 may include one or more functions, operations, or actions as depicted by blocks 401, 403, 405, and/or 407. In some implementations, the various features of the illustrated blocks for method 400 may be combined into fewer blocks, divided into additional blocks, or eliminated based on the desired result. Processing for method 400 may begin at block 401.

Processing for method 400 may begin at block 401 "reset all capacitors in capacitor array." Block 401 may be followed by block 403, "actuate switch in capacitor array to actively charge first capacitor." Block 403 may be followed by block 405, "actuate switch in capacitor array to passively charge first capacitor." Block 405 may be followed by block 407, "generate digital output." Block 407 may be followed by block 409, "determine whether target digital output has been generated."

In block 401, "reset all capacitors in capacitor array" control block 105 is configured actuate switches in unit capacitor array 103 to be operated in closed/opened positions described at phase I set forth above.

In block 403, "actuate switch in capacitor array", control block 105 is configured to actuate switches in unit capacitor array 103 to be operated in closed/opened positions described at phase II to VI set forth above, where only a first capacitor $C_{u1}$ in unit capacitor array 103 is actively charged, the remaining capacitors in unit capacitor array 103 are passively charged.

In block 405, "generate digital output", a digital output may be generated based on a comparison result between an analog signal and an output signal of the unit capacitor array. The output signal may be a voltage. In some embodiments, an output signal may be generated after the switches α-L are operated at phase IV, V or VI shown in Tables 1 to 4.

In block 407, "determine whether resolution of ADC has achieved", control block 105 is configured to determine whether the numbers of the digital output have achieved the resolution of the ADC. When the numbers of the digital output has not achieved the resolution, the method 400 goes to block 403 and keeps generating digital outputs as set forth above. When the numbers of the digital output have achieved the resolution of the ADC, the method 400 goes to block 401 to reset capacitors in the capacitor array.

The various embodiments of the successive approximation register ADC including a unit capacitor array may save energy. In particular, after the unit capacitor array is charged once, a first capacitor in the unit capacitor array is also charged. With the charges stored in the first capacitor, the remaining capacitors in the unit capacitor array may be passively charged through turning on the different switches that connect adjacent capacitors. As a result, the successive approximation register ADC may consume energy $C \cdot Vref^2$, where C is the capacitance of the first capacitor and Vref is the reference voltage level applied to the first capacitor. Moreover, the various embodiments of the successive approximation register ADC including the unit capacitor array may consume less area. For generating N bits of digital outputs, the unit capacitor array may need only (N+1) capacitors. The area consumption of the capacitors used in the successive approximation register ADC is $(N+1) \cdot C_{0Area}$, where $C_{0Area}$ corresponds to the area of a unit value capacitor.

There is little distinction left between hardware and software implementations of aspects of systems; the use of hardware or software is generally (but not always, in that in certain contexts the choice between hardware and software can become significant) a design choice representing cost vs. efficiency tradeoffs. There are various vehicles by which processes and/or systems and/or other technologies described herein can be effected (e.g., hardware, software, and/or firmware), and that the preferred vehicle will vary with the context in which the processes and/or systems and/or other technologies are deployed. For example, if an implementer determines that speed and accuracy are paramount, the implementer may opt for a mainly hardware and/or firmware vehicle; if flexibility is paramount, the implementer may opt for a mainly software implementation; or, yet again alternatively, the implementer may opt for some combination of hardware, software, and/or firmware.

The foregoing detailed description has set form various embodiments of the devices and/or processes via the use of block diagrams, flowcharts, and/or examples. Insofar as such block diagrams, flowcharts, and/or examples contain one or more functions and/or operations, it will be understood by those within the art that each function and/or operation within such block diagrams, flowcharts, or examples can be implemented, individually and/or collectively, by a wide range of hardware, software, firmware, or virtually any combination thereof. In one embodiment, several portions of the subject matter described herein may be implemented via Application Specific Integrated Circuits (ASICs), Field Programmable Gate Arrays (FPGAs), digital signal processors (DSPs), or other integrated formats. However, those skilled in the art will recognize that some aspects of the embodiments disclosed herein, in whole or in part, can be equivalently implemented in integrated circuits, as one or more computer programs running on one or more computers (e.g., as one or more programs running on one or more computer systems), as one or more programs running on one or more processors (e.g., as one or more programs running on one or more microprocessors), as firmware, or as virtually any combination thereof, and that designing the circuitry and/or writing the code for the software and or firmware would be well within the skill of one of skill in the art in light of this disclosure. In addition, those skilled in the art will appreciate that the mechanisms of the subject matter described herein are capable of being distributed as a program product in a variety of forms, and that an illustrative embodiment of the subject matter described herein applies regardless of the particular type of signal bearing medium used to actually carry out the distribution. Examples of a signal bearing medium include, but are not limited to, the following: a recordable type medium such as a floppy disk, a hard disk drive, a Compact Disc (CD), a Digital Video Disk (DVD), a digital tape, a computer memory, etc.; and a transmission type medium such as a digital and/or an analog communication medium (e.g., a fiber optic cable, a waveguide, a wired communications link, a wireless communication link, etc.).

Those skilled in the art will recognize that it is common within the art to describe devices and/or processes in the fashion set forth herein, and thereafter use engineering practices to integrate such described devices and/or processes into data processing systems. That is, at least a portion of the devices and/or processes described herein can be integrated into a data processing system via a reasonable amount of experimentation. Those having skill in the art will recognize that a typical data processing system generally includes one or more of a system unit housing, a video display device, a memory such as volatile and non-volatile memory, processors such as microprocessors and digital signal processors, computational entities such as operating systems, drivers, graphical user interfaces, and applications programs, one or more interaction devices, such as a touch pad or screen, and/or control systems including feedback loops and control motors (e.g., feedback for sensing position and/or velocity; control motors for moving and/or adjusting components and/or quantities). A typical data processing system may be implemented utilizing any suitable commercially available components, such as those typically found in data computing/communication and/or network computing/communication systems.

The herein described subject matter sometimes illustrates different components contained within, or connected with, different other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to disclosures containing only one such recitation, even when the same claim includes the introductory phrases "one or more" or "at least one" and indefinite articles such as "a" or "an" (e.g., "a" and/or "an" should typically be interpreted to mean "at least one" or "one or more"); the same holds true for the use of definite articles used to introduce claim recitations. In addition, even if a specific number of an introduced claim recitation is explicitly recited, those skilled in the art will recognize that such recitation should typically be interpreted to mean at least the recited number (e.g., the bare recitation of "two recitations," without other modifiers, typically means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings should be understood to contemplate the possibilities of including one of the terms, either of the terms, or both terms. For example, the phrase "A or B" will be understood to include the possibilities of "A" or "B" or "A and B."

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

We claim:

1. An analog to digital converter, comprising:
a capacitor array including:
a first capacitor;
a second capacitor;
a third capacitor;
a fourth capacitor;
a first switch, wherein the first switch is coupled between a first reference node and a first terminal of the first capacitor;
a second switch, wherein the second switch is coupled between a second terminal of the first capacitor and a second reference node;
a third switch, wherein the third switch is coupled between the first terminal of the first capacitor and a first terminal of the second capacitor;
a fourth switch, wherein the fourth switch is coupled between the second terminal of the first capacitor and the first terminal of the second capacitor;
a fifth switch, wherein the fifth switch is coupled between a second terminal of the second capacitor and the second reference node;
a sixth switch, wherein the sixth switch is coupled between the first terminal of the second capacitor and a first terminal of the third capacitor;
a seventh switch, wherein the seventh switch is coupled between the first terminal of the third capacitor and the second terminal of the second capacitor, wherein a second terminal of the third capacitor is coupled to the second reference node;
an eighth switch, wherein the eighth switch is coupled between the first terminal of the third capacitor and a first terminal of the fourth capacitor, wherein a second terminal of the fourth capacitor is coupled to the second reference node;
a ninth switch, wherein the ninth switch is coupled between an output terminal of the capacitor array and a third reference node;
a tenth switch, wherein the tenth switch is coupled between the output terminal of the capacitor array and the first terminal of the first capacitor;
an eleventh switch, wherein the eleventh switch is coupled between the output terminal of the capacitor array and the first terminal of the second capacitor; and a twelfth switch, wherein the twelfth switch is coupled between the output terminal of the capacitor array and the first terminal of the third capacitor;

a comparator, wherein a first input terminal of the comparator is coupled to an analog signal input node, a second input terminal of the comparator is coupled to the output terminal of the capacitor array, and the comparator is configured to compare signals received from the analog input node to signals received from the output terminal of the capacitor array; and a control block, wherein a feedback input terminal of the control block is coupled to an output terminal of the comparator, and the control block is configured to selectively open or close the switches, receive a comparison result from the comparator, and generate a digital output based on the comparison result.

2. The analog to digital converter of claim 1, wherein one or more of the first reference node, the second reference node, and/or the third reference node correspond to one of: a low power supply terminal, a high power supply terminal, a voltage reference terminal, or a ground terminal of the analog to digital converter.

3. The analog to digital converter of claim 1, wherein one or more of the first capacitor, the second capacitor, the third capacitor, and/or the fourth capacitor have equal capacitance values.

4. The analog to digital converter of claim 1, wherein the control block is configured to selectively operate the first switch in an opened position, and selectively operate the second switch, the third switch, the fourth switch, the fifth switch, the sixth switch, the seventh switch and the eighth switch in a closed position to discharge the first capacitor, the second capacitor, the third capacitor and the fourth capacitor via the second reference node.

5. The analog to digital converter of claim 1, wherein the control block is configured to selectively operate the first switch and the second switch in a closed position so that the first capacitor is charged to a potential difference between the first reference node and the second reference node.

6. The analog to digital converter of claim 1, wherein the control block is configured to selectively operate the second switch, the third switch, and the fifth switch in a closed position, and selectively operate the first switch and the fourth switch in an opened position to redistribute charge between the first capacitor and the second capacitor.

7. The analog to digital converter of claim 1, wherein the control block is configured to selectively operate the second switch, the fifth switch and the sixth switch in a closed position, and selectively operate the first switch, the third switch, and the fourth switch in an opened position to redistribute charge between the second capacitor and the third capacitor.

8. The analog to digital converter of claim 1, wherein the control block is configured to selectively operate the fifth switch and the eighth switch in a closed position, and selectively operate the sixth switch, the seventh switch, and the twelfth switch in an opened position to redistribute charge between the third capacitor and the fourth capacitor.

9. The analog to digital converter of claim 1, wherein the first capacitor and the second capacitor are series coupled in response to the fourth switch being operated in the closed position, and the second switch, the third switch and the sixth switch being operated in the opened position.

10. The analog to digital converter of claim 1, wherein the second capacitor and the third capacitor are series coupled in response to the seventh switch being configured to be operated in a closed position, and the fifth switch, the sixth switch, and the eighth switch being operated in the opened position.

11. The analog to digital converter of claim 1, wherein the first capacitor, the second capacitor, and the third capacitor are series coupled in response to both the fourth switch and the seventh switch being configured to be operated in the closed position, and the second switch, the third switch, the fifth switch, the sixth switch, and the eighth switch being operated in the opened position.

12. A method to convert an analog signal to a digital signal, comprising:

providing a capacitor array of an analog to digital converter, wherein the capacitor array includes:

a first capacitor;

a second capacitor;

a third capacitor;

a fourth capacitor;

a first switch, wherein the first switch is coupled between a first reference node and a first terminal of the first capacitor;

a second switch, wherein the second switch is coupled between a second terminal of the first capacitor and a second reference node;

a third switch, wherein the third switch is coupled between the first terminal of the first capacitor and a first terminal of the second capacitor;

a fourth switch, wherein the fourth switch is coupled between the second terminal of the first capacitor and the first terminal of the second capacitor;

a fifth switch, wherein the fifth switch is coupled between a second terminal of the second capacitor and the second reference node;

a sixth switch, wherein the sixth switch is coupled between the first terminal of the second capacitor and a first terminal of the third capacitor;

a seventh switch, wherein the seventh switch is coupled between the first terminal of the third capacitor and the second terminal of the second capacitor, wherein a second terminal of the third capacitor is coupled to the second reference node;

an eighth switch, wherein the eighth switch is coupled between the first terminal of the third capacitor and a first terminal of the fourth capacitor, wherein a second terminal of the fourth capacitor is coupled to the second reference node;

a ninth switch, wherein the ninth switch is coupled between an output terminal of the capacitor array and a third reference node;

a tenth switch, wherein the tenth switch is coupled between the output terminal of the capacitor array and the first terminal of the first capacitor;

an eleventh switch, wherein the eleventh switch is coupled between the output terminal of the capacitor array and the first terminal of the second capacitor; and a twelfth switch, wherein the twelfth switch is coupled between the output terminal of the capacitor array and the first terminal of the third capacitor;

resetting the first capacitor, the second capacitor, the third capacitor and the fourth capacitor in the capacitor array by discharging the first capacitor, the second capacitor, the third capacitor and the fourth capacitor;

actuating the third switch, the tenth switch, the twelfth switch, and the eleventh switch to be operated in an opened position and the first switch to be operated in a closed position to actively charge the first capacitor in the capacitor array;

actuating the first switch to be operated in an opened position to passively charge the second capacitor, the third capacitor and the fourth capacitor in the capacitor array;

generating a digital signal based on a comparison result between an analog signal and an output signal of the capacitor array, wherein the output signal is associated with operated positions of the switches in the capacitor array; and determining whether a resolution of the analog to digital converter has been achieved.

13. The method of claim 12, wherein the generating the digital signal occurs after the actuating the first switch to be operated in the opened position.

14. The method of claim 13, further comprising actuating one of the tenth switch, the twelfth switch, or the eleventh switch to be operated in a closed position and the ninth switch to be operated in an opened position.

15. The method of claim 12, wherein the actuating the third switch, the tenth switch, the twelfth switch, and the eleventh switch to be operated in the opened position and the first switch to be operated in the closed position further comprises actuating the second switch, the fourth switch, the fifth switch, the sixth switch, the seventh switch, the eighth switch and the ninth switch to be operated in a closed position.

16. The method of claim 12, wherein the resetting occurs in response to the resolution of the analog to digital converter being achieved.

17. The method of claim 12, wherein the actuating the first switch occurs in response to the resolution of the analog to digital converter not being achieved.

18. The method of claim 12, wherein the actuating the first switch to be operated in the opened position further comprises:
 actuating the second switch, the third switch, and the fifth switch in a closed position; and
 actuating the fourth switch in an opened position to redistribute charge between the first capacitor and the second capacitor in the capacitor array.

19. The method of claim 12, wherein the actuating the first switch to be operated in the opened position further comprises:
 actuating the second switch, the fifth switch, and the sixth switch in a closed position; and
 actuating the third switch, and the fourth switch in an opened position to redistribute charge between the second capacitor and the third capacitor in the capacitor array.

20. The method of claim 12, wherein the actuating the first switch to be operated in the opened position further comprises:
 actuating the fifth switch and the eighth switch in a closed position; and
 actuating the sixth switch, the seventh switch, and the twelfth switch in an opened position to redistribute charge between the third capacitor and the fourth capacitor in the capacitor array.

21. An analog to digital converter, comprising:
 a first capacitor array including:
  a first capacitor;
  a second capacitor;
  a third capacitor;
  a fourth capacitor;
  a first switch, wherein the first switch is coupled between a first reference node and a first terminal of the first capacitor;
  a second switch, wherein the second switch is coupled between a second terminal of the first capacitor and a second reference node;
  a third switch, wherein the third switch is coupled between the first terminal of the first capacitor and a first terminal of the second capacitor;
  a fourth switch, wherein the fourth switch is coupled between the second terminal of the first capacitor and the first terminal of the second capacitor;
  a fifth switch, wherein the fifth switch is coupled between a second terminal of the second capacitor and the second reference node;
  a sixth switch, wherein the sixth switch is coupled between the first terminal of the second capacitor and a first terminal of the third capacitor;
  a seventh switch, wherein the seventh switch is coupled between the first terminal of the third capacitor and the second terminal of the second capacitor, wherein a second terminal of the third capacitor is coupled to the second reference node;
  an eighth switch, wherein the eighth switch is coupled between the first terminal of the third capacitor and a first terminal of the fourth capacitor, wherein a second terminal of the fourth capacitor is coupled to the second reference node;
  a ninth switch, wherein the ninth switch is coupled between an output terminal of the capacitor array and a third reference node;
  a tenth switch, wherein the tenth switch is coupled between the output terminal of the capacitor array and the first terminal of the first capacitor;
  an eleventh switch, wherein the eleventh switch is coupled between the output terminal of the capacitor array and the first terminal of the second capacitor; and
  a twelfth switch, wherein the twelfth switch is coupled between the output terminal of the capacitor array and the first terminal of the third capacitor;
 a differential difference comparator, wherein a first input terminal of the differential difference comparator is coupled to a first analog signal input node, a second input terminal of the differential difference comparator is coupled to the output terminal of the first capacitor array; and
 a control block, wherein a feedback input terminal of the control block is coupled to an output terminal of the differential difference comparator, and the control block is configured to selectively open or close the switches, receive a comparison result from the differential difference comparator, and generate a digital output based on the comparison result.

22. The analog to digital converter of claim 21, wherein the differential difference comparator includes a third input terminal coupled to a second analog signal input node, and a fourth input terminal coupled to an output terminal of a second capacitor array.

* * * * *

UNITED STATES PATENT AND TRADEMARK OFFICE
CERTIFICATE OF CORRECTION

PATENT NO. : 8,610,616 B2
APPLICATION NO. : 13/390937
DATED : December 17, 2013
INVENTOR(S) : Baghini et al.

Page 1 of 2

It is certified that error appears in the above-identified patent and that said Letters Patent is hereby corrected as shown below:

On Title Page 2, in Item (56), under "OTHER PUBLICATIONS", in Column 2, Line 37, delete "Redistriution" and insert -- Redistribution --, therefor.

In the Specifications

In Column 3, Line 49, delete "ADC and;" and insert -- ADC; and --, therefor.

In Column 4, Line 47, delete "($S_{OUT}$)" and insert -- ($S_{OUT}$). --, therefor.

In Column 6, Lines 9-10, delete "($V_{REF1}$, 115)" and insert -- ($V_{REF2}$, 115) --, therefor.

In Column 8, Line 52, delete "$Q_{Cu2}$" and insert -- $C_{u2}$ --, therefor.

In Column 8, Lines 66-67, in Equation (11), delete "$V_{Y1(Phase\ IV)} = V_{Z1(Phase\ IV)} = V_{Y1(Phase\ III)}(C_{u1})/(C_{u2}+C_{u3})$" and insert -- $V_{Y1(Phase\ IV)} = V_{Z1(Phase\ IV)} = V_{Y1(Phase\ III)} \cdot (C_{u2}) / (C_{u2} + C_{u3})$ --, therefor.

In Column 10, Line 14, delete "$Q_{Cu3}=_{Cu3} \cdot V_{Z1}$," and insert -- $Q_{Cu3}=C_{u3} \cdot V_{Z1}$, --, therefor.

In Column 10, Line 16, delete "$Q_{Cu4}=C_{u4} \cdot V_{Z1}$," and insert -- $Q_{Cu4}=C_{u4} \cdot V_{Z2}$, --, therefor.

In Column 10, Line 33, delete "me" and insert -- the --, therefor.

In Column 10, Line 48, delete "M" and insert -- H --, therefor.

In Column 12, Line 34, delete "set form" and insert -- set forth --, therefor.

Signed and Sealed this
Sixth Day of May, 2014

Michelle K. Lee
*Deputy Director of the United States Patent and Trademark Office*

CERTIFICATE OF CORRECTION (continued)
U.S. Pat. No. 8,610,616 B2

In Column 14, Line 66, delete "oh the" and insert -- on the --, therefor.

In Column 15, Line 17, delete "$V_{Z1(phase\ IV)}$" and insert -- $V_{X1(phase\ IV)}$ --, therefor.

In Column 15, Line 21, delete "outputs," and insert -- outputs. --, therefor.

In Column 15, Line 67, delete "(e.g., $V_{REFOUT2}$)" and insert -- (e.g., $V_{REFOUT2}$). --, therefor.

In Column 16, Line 44, delete "to me" and insert -- to the --, therefor.

In Column 17, Lines 21-22, delete "array" control block 105 is configured" and insert -- array", control block 105 is configured to --, therefor.

In Column 17, Line 36, delete "α-L" and insert -- B-L --, therefor.

In Column 18, Line 15, delete "set form" and insert -- set forth --, therefor.

In Column 20, Line 1, delete "haying" and insert -- having --, therefor.

In Column 20, Line 15, delete "or drawings" and insert -- or drawings, --, therefor.